US012374269B2

(12) United States Patent
Kang et al.

(10) Patent No.: US 12,374,269 B2
(45) Date of Patent: Jul. 29, 2025

(54) DISPLAY DEVICE

(71) Applicant: Samsung Display Co., LTD., Yongin-si (KR)

(72) Inventors: Sun Ho Kang, Yongin-si (KR); Deok Young Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/424,220

(22) Filed: Jan. 26, 2024

(65) Prior Publication Data

US 2025/0014505 A1    Jan. 9, 2025

(30) Foreign Application Priority Data

Jul. 6, 2023    (KR) .................. 10-2023-0087729

(51) Int. Cl.
*G09G 3/32* (2016.01)
*H10K 59/131* (2023.01)

(52) U.S. Cl.
CPC .............. *G09G 3/32* (2013.01); *H10K 59/131* (2023.02); *G09G 2300/0426* (2013.01); *G09G 2300/0842* (2013.01); *G09G 2300/0861* (2013.01); *G09G 2320/0233* (2013.01); *G09G 2320/0247* (2013.01); *G09G 2320/029* (2013.01); *G09G 2360/144* (2013.01)

(58) Field of Classification Search
CPC ............. G09G 3/32; G09G 2300/0426; G09G 2300/0842; G09G 2300/0861; G09G 2320/0233; G09G 2320/0247; G09G 2320/029; G09G 2360/144; H10K 59/131
See application file for complete search history.

(56) References Cited

U.S. PATENT DOCUMENTS

| | | | |
|---|---|---|---|
| 2018/0165533 A1* | 6/2018 | Cho | G09G 5/003 |
| 2018/0285619 A1* | 10/2018 | Kim | G09G 3/3208 |
| 2019/0355302 A1 | 11/2019 | Ding et al. | |
| 2021/0065635 A1* | 3/2021 | Choi | G09G 3/3225 |
| 2023/0180578 A1* | 6/2023 | Jinta | H10K 59/353 |
| | | | 257/89 |

FOREIGN PATENT DOCUMENTS

| | | |
|---|---|---|
| CN | 109686313 | 6/2021 |
| KR | 10-2008-0047332 | 5/2008 |
| KR | 10-2020-0108256 | 9/2020 |

\* cited by examiner

*Primary Examiner* — David Tung
(74) *Attorney, Agent, or Firm* — KILE PARK REED & HOUTTEMAN PLLC

(57) ABSTRACT

A display device according to an embodiment includes a display area including a first display area and a sensor area, a first pixel located in the first display area, and including a first pixel circuit and a first light emitting element connected to the first pixel circuit, and a second pixel located in the sensor area, and including a second pixel circuit and a second light emitting element connected to the second pixel circuit, structures of the first pixel circuit and the second pixel circuit being different. The second pixel circuit includes a switching element connected between a power line to which an off voltage of the second light emitting element is applied and the second light emitting element and turned on by an off-control signal.

23 Claims, 14 Drawing Sheets

PL : VDL, VSL, VIL1, VIL2, VOBL
SL : SL1, SL2, SL3, SL4
T : T1, T2, T3, T4, T5, T6, T7, T8

PL : VDL, VSL, VIL1, VIL2, VOBL
SL : SL1, SL2, SL3, SL4
T : T1, T2, T3, T4, T5, T6, T7, T8, T9

DISPLAY DEVICE

CROSS-REFERENCE TO RELATED APPLICATION(S)

This application claims priority to and benefits of Korean Patent Application No. 10-2023-0087729 under 35 U.S.C. 119, filed on Jul. 6, 2023, in the Korean Intellectual Property Office (KIPO), the entire contents of which are incorporated herein by reference.

BACKGROUND

1. Technical Field

Embodiments of the disclosure relate to a display device.

2. Description of the Related Art

The importance of display devices has steadily increased with the development of multimedia technology. Accordingly, various types of display devices such as a liquid crystal display device, an organic light emitting display device and the like have been developed.

The display device may include various sensors to provide various functions. For example, the display device may include an infrared proximity sensor.

SUMMARY

Aspects of the disclosure provide a display device capable of preventing unintentional emission from a pixel at a position corresponding to a sensor area due to an operation of a sensor.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an aspect of the disclosure, a display device may include a display area including a first display area and a sensor area, a first pixel located in the first display area, and including a first pixel circuit and a first light emitting element connected to the first pixel circuit, and a second pixel located in the sensor area, and including a second pixel circuit and a second light emitting element connected to the second pixel circuit, structures of the first pixel circuit and the second pixel circuit being different. The second pixel circuit may include a switching element connected between a power line to which an off voltage of the second light emitting element is applied and the second light emitting element and turned on by an off-control signal.

In an embodiment, the display device may further include a driving circuit supplying the off-control signal to the second pixel.

In an embodiment, the display device may further include a signal line connected between the driving circuit and the second pixel and transmitting the off-control signal from the driving circuit to the second pixel. The switching element may include a gate electrode connected to the signal line, a first electrode connected to an electrode of the second light emitting element, and a second electrode connected to the power line.

In an embodiment, the display device may further include a substrate including a main region including the display area in which pixels including the first pixel and the second pixel are arranged, and a sub-region located on a side of the main region in a first direction, and a data driving circuit disposed on the sub-region and supplying a data signal to the pixels. The display area may include a central area located at a center of the display area in a second direction intersecting the first direction and aligned with the sub-region in the first direction, and in which first data lines and some of the pixels connected to the first data lines are arranged, and an edge area located on at least one side of the central area in the second direction, and in which second data lines and another ones of the pixels connected to the second data lines are arranged.

In an embodiment, the display device may further include connection lines disposed on the substrate and connected between the data driving circuit and the second data lines. Each of the connection lines may include a first connection line connected between the data driving circuit and one of the second data lines and extending in the first direction in the display area, and a second connection line connected between the first connection line and the one of the second data lines and extending in the second direction in the display area.

In an embodiment, the display device may further include a circuit layer disposed on the substrate and including pixel circuits of the pixels including the first pixel circuit and the second pixel circuit, the first data lines, the second data lines, the power line, and the signal line.

In an embodiment, the circuit layer may further include a semiconductor layer including an active layer of the switching element, a first gate conductive layer including the gate electrode of the switching element, a first source-drain conductive layer including the second connection line, and a second source-drain conductive layer including the first connection line.

In an embodiment, the power line may be connected to the second electrode of the switching element in the sensor area.

In an embodiment, the signal line may be connected to the gate electrode of the switching element in the sensor area.

In an embodiment, the display device may further include a light emitting element layer disposed on the circuit layer and including light emitting elements of the pixels including the first light emitting element and the second light emitting element.

In an embodiment, the display device may further include a first pixel power line connected to the first pixel circuit and the second pixel circuit and supplied with a first pixel power voltage, and a second pixel power line connected to the first light emitting element and the second light emitting element and supplied with a second pixel power voltage having a lower potential than the first pixel power voltage.

In an embodiment, the switching element may be connected to the second pixel power line.

In an embodiment, the power line to which the switching element may be connected is separated from the first pixel power line and the second pixel power line.

In an embodiment, the power line may be connected between the driving circuit and the second pixel, and the driving circuit may supply the off voltage of the second light emitting element to the power line.

In an embodiment, the display device may further include a sensor provided in the sensor area, and the driving circuit may supply the off-control signal to the second pixel during a period in which the sensor operates.

In an embodiment, the sensor may emit infrared rays passing through the sensor area where the second pixel is located.

In an embodiment, the sensor may be an infrared proximity sensor.

In an embodiment, each of the first pixel circuit and the second pixel circuit may include pixel transistors and a capacitor controlling a driving current in response to a scan signal and the data signal supplied to the first pixel or the second pixel, and the second pixel circuit may further include the switching element in addition to the pixel transistors and the capacitor.

In an embodiment, the first display area may not overlap the sensor area in a plan view, and the switching element may be provided only in the second pixel.

In an embodiment, the second pixel may include a plurality of second pixels in the sensor area, and each of the plurality of second pixels may include the switching element connected between the power line and the second light emitting element and simultaneously turned on by the off-control signal.

The display device according to embodiments may include a second pixel positioned in the sensor area. The second pixel may include a switching element that is turned on by an off-control signal and connects a light emitting element to a power line to which an off voltage of the light emitting element is applied. According to embodiments, by turning on the switching element by the off-control signal while the sensor operates, the second pixel may be prevented from emitting light in an unintended form. Accordingly, an image quality problem of the display device that may be caused by the operation of the sensor may be prevented or improved.

In embodiments, the non-display area of the display device may be reduced by connecting data lines positioned at an edge area of the display area to a data driving circuit through connection lines passing through a central area of the display area. In addition, some of dummy lines formed in the display area in a form corresponding to the connection lines may be utilized as a part of control signal lines, for example, the control signal line inside the display area, that transmits an off-control signal to the switching element of the second pixel. Accordingly, the second pixel may be connected to the control signal line without forming an additional signal line in the display area.

However, effects according to the embodiments of the disclosure are not limited to those described above and various other effects are incorporated herein.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
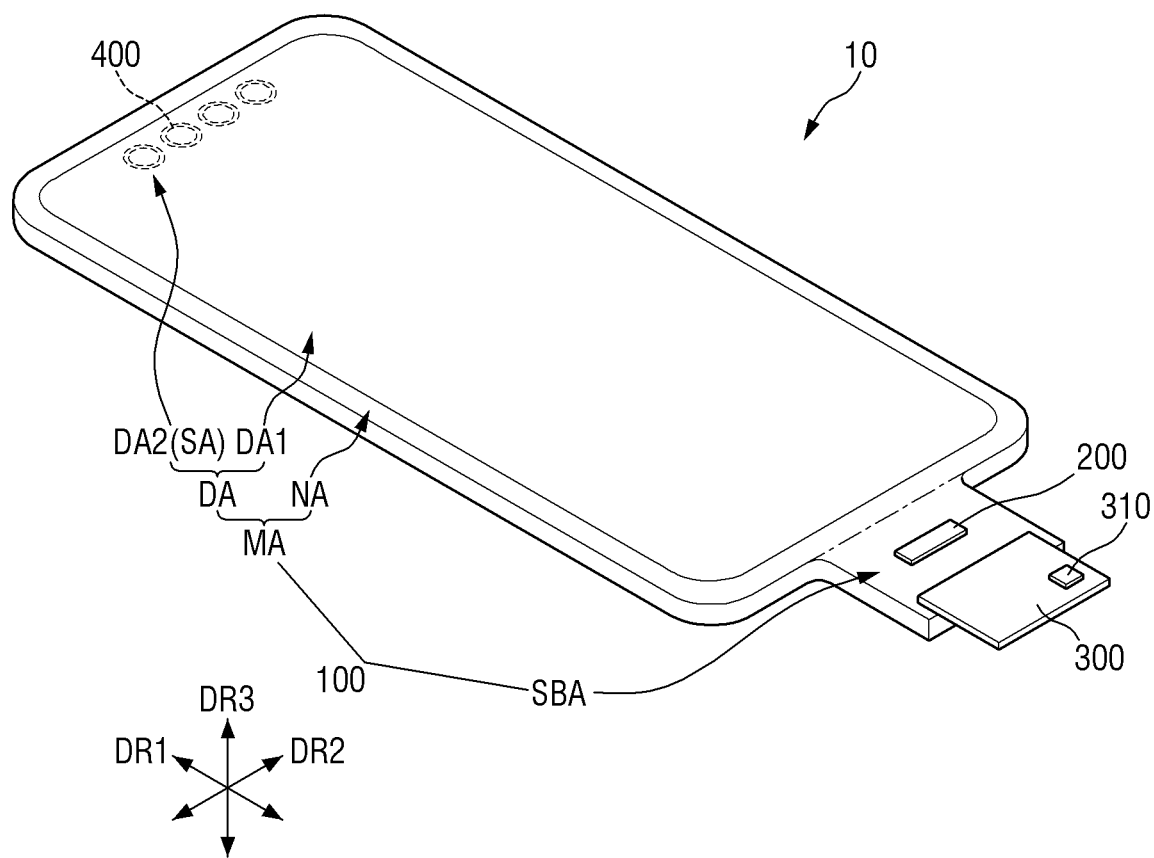
FIG. 1 is a perspective view illustrating a display device according to one embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Features of each of various embodiments of the disclosure may be partially or entirely combined with each other and may technically variously interwork with each other, and respective embodiments may be implemented independently of each other or may be implemented together in association with each other.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a perspective view illustrating a display device 10 according to one embodiment.

Referring to FIG. 1, a display device 10 may be a device for displaying a moving image or a still image. The display device 10 may be used as a display screen of various devices, such as a television, a laptop computer, a monitor, a billboard and an Internet-of-Things (IoT) device, as well as portable electronic devices such as a mobile phone, a smartphone, a tablet personal computer (PC), a smart watch, a watch phone, a mobile communication terminal, an electronic notebook, an electronic book, a portable multimedia player (PMP), a navigation device and an ultra-mobile PC (UMPC).

The display device 10 may be a light emitting display device such as an organic light emitting display including an organic light emitting diode, a quantum dot light emitting display including a quantum dot light emitting layer, an inorganic light emitting display including an inorganic semiconductor, or a micro light emitting display using a micro or nano light emitting diode (LED). In the following, an embodiment in which the display device 10 is an organic light emitting display device is described, but the type of display device 10 is not limited thereto.

In one embodiment, the display device 10 may be formed flat. For example, the display device 10 may be formed substantially flat on a plane defined by a first direction DR1 and a second direction DR2, and may have a thickness (e.g., a predetermined or selectable thickness (or height)) in a third direction DR3. In another embodiment, the display device 10 may include a curved surface in at least a part including an edge region and the like. The display device 10 may be formed flexibly so that it can be curved, bent, folded, or rolled.

In one embodiment, with respect to the image display surface of the display device 10, the first direction DR1 may be a vertical direction, a column direction, or a perpendicular direction, and the second direction DR2 may be a direction intersecting the first direction DR1, for example, a widthwise direction, a row direction, or a horizontal direction. The third direction DR3 may be a thickness direction or a height direction of the display device 10.

The display device 10 may include a display panel 100, a data driving circuit 200, a circuit board 300, and a driving circuit 310. The display device 10 may further include a sensor 400 positioned below the display panel 100 to overlap a part (e.g., a part of a display area DA) of the display panel 100 in a plan view.

The display panel 100 may include a main region MA and a sub-region SBA located on a side of the main region MA. For example, the sub-region SBA may be located on a side of the main region MA in the first direction DR1.

The main region MA may include the display area DA in which pixels are arranged and a non-display area NA adjacent to the display area DA. The main region MA may further include a sensor area SA in which the sensor 400 is provided or disposed. In one embodiment, the sensor area SA may be positioned inside the display area DA. For example, the sensor 400 may be disposed below the pixels to overlap the pixels positioned in a part of the display area DA in a plan view.

The display area DA may overlap the sensor area SA or may include the sensor area SA. For example, the display area DA may include a first display area DA1 and a second display area DA2, and the second display area DA2 may be an area corresponding to the sensor area SA of the display area DA. For example, the second display area DA2 may be a part of the display area DA that includes the sensor area SA or overlaps the sensor area SA. For example, the second display area DA2 and the sensor area SA may be substantially the same area. The first display area DA1 may be another portion of the display area DA, for example, a remaining portion of the display area DA that does not include the sensor area SA or does not overlap the sensor area SA.

The display area DA may overlap at least one sensor area SA, and at least one sensor 400 may be provided in each of the sensor areas SA. By overlapping the display area DA with the sensor area SA (e.g., disposing the sensor area SA inside the display area DA), the non-display area NA may be reduced, and the display area DA may be extended.

In one embodiment, the sensor 400 may be positioned below pixels positioned in the second display area DA2 (e.g., the sensor area SA) and may emit infrared rays passing through at least a part of the second display area DA2 including the sensor area SA. For example, the sensor 400 may be an infrared proximity sensor including a light emitting element (e.g., an infrared light emitting diode) that emits infrared rays and a sensing element (e.g., an infrared receiving diode) that receives infrared rays and outputs a corresponding electrical signal.

The non-display area NA may be positioned adjacent to the display area DA. For example, the non-display area NA may surround the display area DA in a plan view. Wires connected to pixels may be disposed in the non-display area NA.

In one embodiment, an embedded circuit may be disposed in the non-display area NA. For example, an embedded circuit including a scan driving circuit or the like may be disposed in the non-display area NA positioned on a side (e.g., the left side or the right side) or both sides of the display area DA.

The sub-region SBA may protrude in the first direction DR1 from a side of the main region MA. For example, the sub-region SBA may protrude from the lower end of the main region MA in the first direction DR1 and may have a narrower width than the main region MA in the second direction DR2.

In one embodiment, the data driving circuit 200 may be mounted in the sub-region SBA. The circuit board 300 may be disposed on a part (e.g., a pad area positioned at one end in the first direction DR1) of the sub-region SBA.

In the sub-region SBA, wires (or a part of wires) connected to the pixels of the display area DA, the data driving circuit 200, and the circuit board 300 may be disposed. In describing embodiments, the term "connect" may include electrical connection and/or physical connection.

The data driving circuit 200 may generate data signals for driving pixels corresponding to image data. In one embodiment, the data driving circuit 200 may be implemented as an integrated circuit chip (IC) and mounted in the sub-region SBA. In another embodiment, the data driving circuit 200 may be provided on the circuit board 300 on the sub-region SBA or may be provided on another circuit board connected to the display panel 100 through the circuit board 300.

The circuit board 300 may be disposed on a part of the sub-region SBA. For example, the circuit board 300 may be bonded on the pads positioned at an end of the sub-region SBA, and may supply or transmit power voltages and driving signals for driving the display panel 100 to the display panel 100. The circuit board 300 may be a flexible film such as a flexible printed circuit board (FPCB), a printed circuit board (PCB), or a chip on film (COF), but is not limited thereto.

In one embodiment, the driving circuit 310 may be mounted on the circuit board 300. For example, the driving circuit 310 may be provided as an integrated circuit chip and mounted on the circuit board 300. In another embodiment, at least a part of the driving circuit 310 may be mounted on the sub-region SBA together with the data driving circuit 200 or may be provided on another circuit board connected to the circuit board 300.

The driving circuit 310 may supply input image data (e.g., digital image data), driving signals including timing signals, and/or driving voltages to the display panel 100 and the data driving circuit 200. For example, the driving circuit 310 may include a timing control circuit and/or a power management integrated circuit (PMIC).

In one embodiment, the driving circuit 310 may supply an off-control signal, which controls pixels not to emit light, to the pixels (e.g., second pixels PX2 of FIG. 2) positioned in the second display area DA2 during a period (e.g., a sensing period in which a proximity sensor operates) in which the sensor 400 operates. The pixels of the second display area DA2 supplied with the off-control signal may be turned off (e.g., non-emitted) corresponding to the off-control signal.

Figure 2:
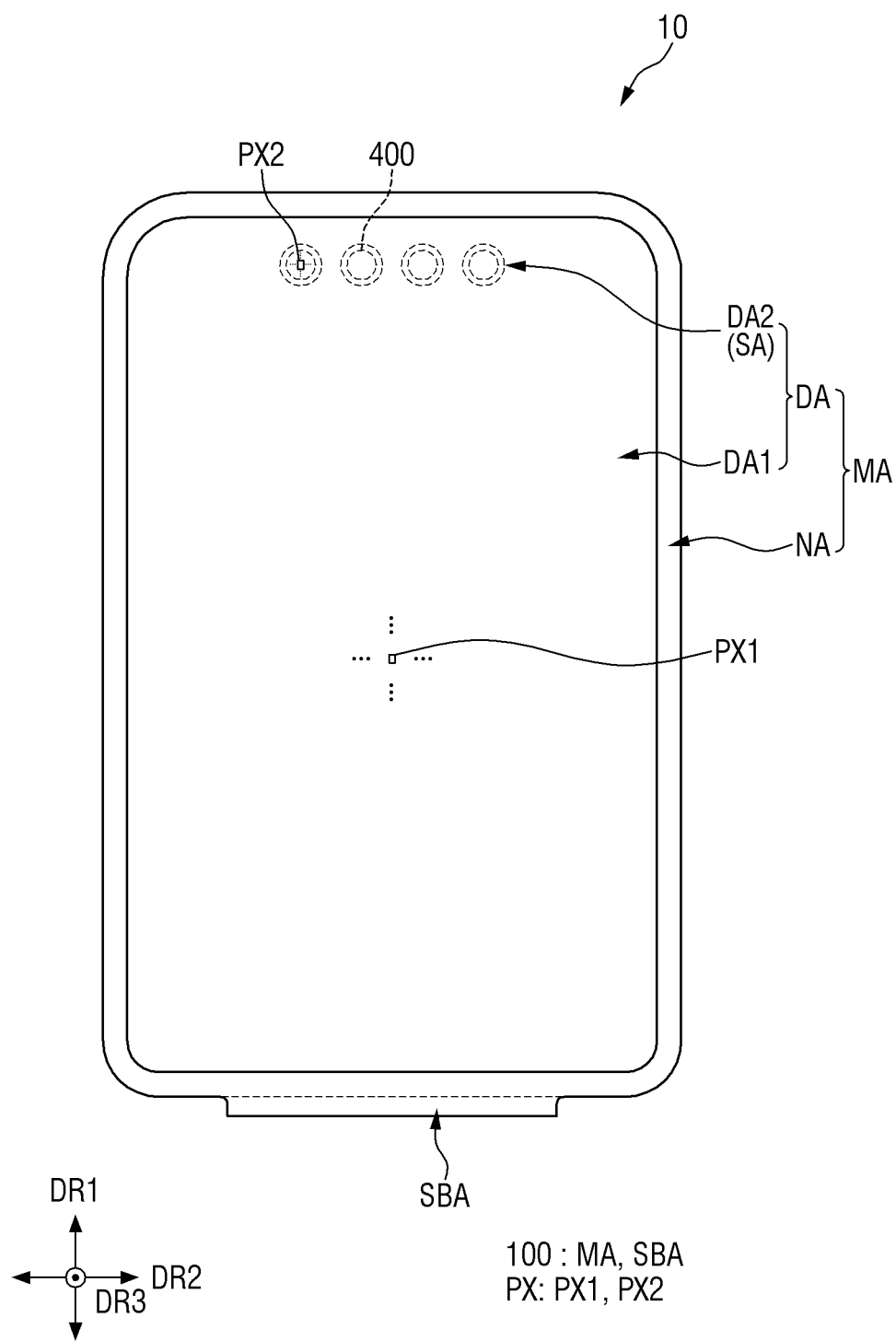
FIG. 2 is a plan view illustrating the display device of FIG. 1.

FIG. 2 is a plan view illustrating the display device 10 of FIG. 1. FIG. 1 shows the display device 10 unfolded without bending, and FIG. 2 shows the display device 10 bent in the sub-region SBA. For example, FIG. 1 illustrates a state in which the sub-region SBA is spread out parallel to the main region MA, and FIG. 2 illustrates a state in which the sub-region SBA is bent such that a part of the sub-region SBA is positioned below in the main region MA.

Referring to FIGS. 1 and 2, the display area DA may include a long side in the first direction DR1 and a short side in the second direction DR2 and may be formed as a plane having an approximately rectangular shape in a plan view. A corner portion at which the long side and the short side of the display area DA meet may be rounded or right-angled. The shape of the display area DA in plan view is not limited to a rectangular shape, but may be formed in another polygonal shape, a circular shape, an elliptical shape, or the like.

The display area DA may occupy most of the main region MA. The display area DA may be disposed at the center of the main region MA.

The display area DA may include pixels PX. In one embodiment, the pixels PX may include first pixels PX1 positioned in the first display area DA1 and the second pixels PX2 positioned in the second display area DA2 (e.g., the sensor area SA).

The first pixels PX1 may have substantially the same or similar structure and/or configuration, and the second pixels PX2 may have substantially the same or similar structure. The first pixels PX1 and the second pixels PX2 may have different structures and/or configurations. For example, each of the second pixels PX2 may further include at least one switching element compared to each of the first pixels PX1.

The non-display area NA may be positioned at an edge of the main region MA. In one embodiment, the non-display area NA may be positioned outside the display area DA and may surround the display area DA in a plan view. The non-display area NA may be in contact with the sub-region SBA. For example, the sub-region SBA may extend from an end of the non-display area NA in the first direction DR1.

At least a part of the sub-region SBA may be formed to be flexible so that it can be curved, bent, folded, or rolled. The sub-region SBA may be bent at a portion adjacent to the non-display area NA. Accordingly, a portion of the sub-region SBA in which the data driving circuit 200 is mounted may be positioned below the main region MA.

The data driving circuit 200 may be connected to the pixels PX, for example, the first pixels PX1 and the second pixels PX2 of the display area DA. The data driving circuit 200 may supply respective driving signals (e.g., data signals of the first pixels PX1 and the second pixels PX2) to the first pixels PX1 and the second pixels PX2.

Figure 3:
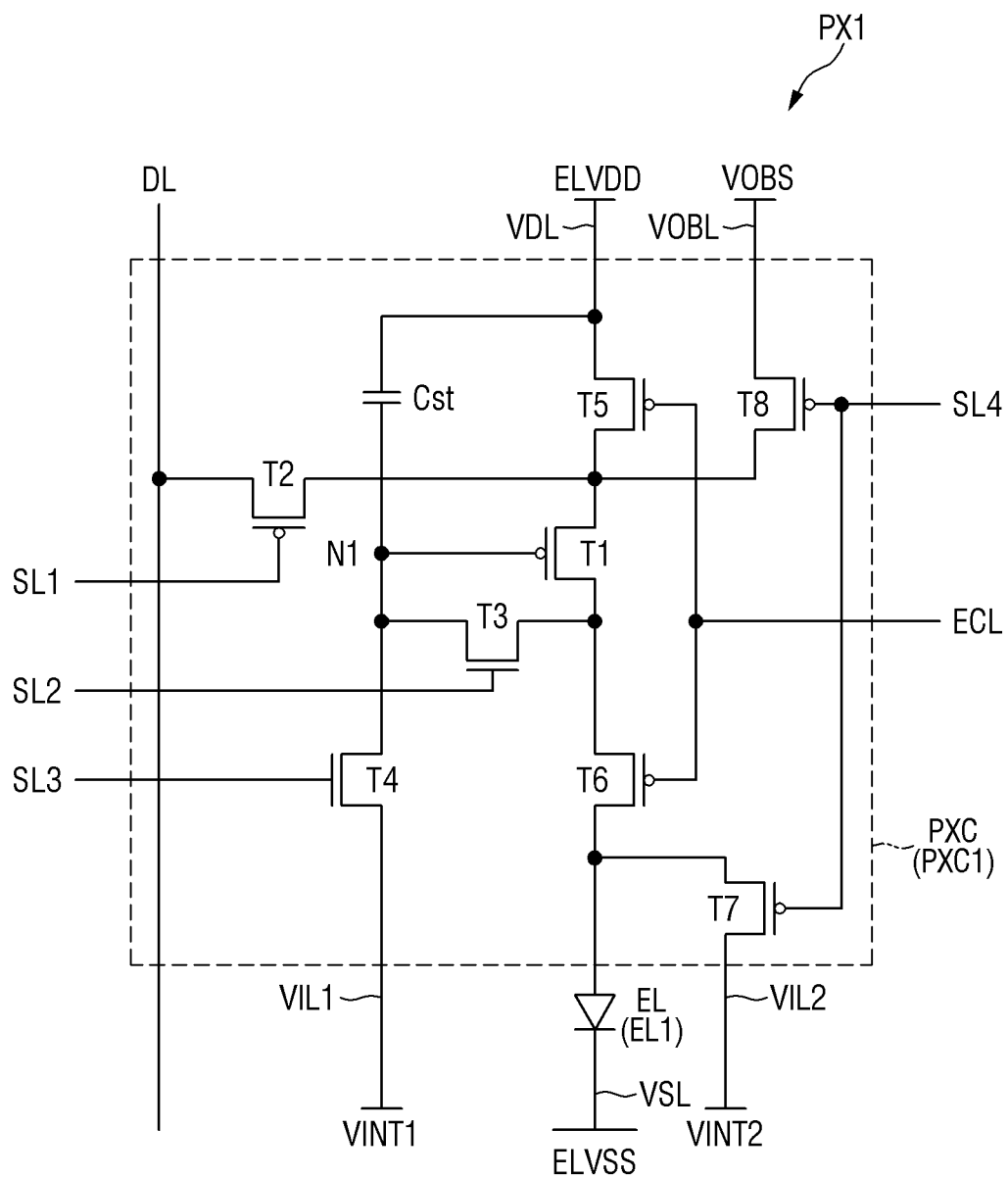
FIG. 3 is a schematic diagram of an equivalent circuit of a first pixel according to one embodiment.

FIG. 3 is a schematic diagram of an equivalent circuit of the first pixel PX1 according to one embodiment.

In FIG. 3, an embodiment in which a first pixel circuit PXC1 provided to the first pixel PX1 includes first to eighth transistors T1 to T8 will be described. In one embodiment, scan lines SL connected to the first pixel PX1 may include a first scan line SL1, a second scan line SL2, a third scan line SL3, and a fourth scan line SL4, and power lines PL connected to the first pixel PX1 may include a first pixel power line VDL, a second pixel power line VSL, a first initialization power line VIL1, a second initialization power line VIL2, and a bias power line VOBL. The first pixel PX1 may be further connected to an emission control line ECL. The configuration of the first pixel circuit PXC1 and the type and number of wires connected to the first pixel circuit PXC1 may be variously changed according to embodiments.

Referring to FIG. 3 in addition to FIGS. 1 and 2, each of the pixels PX (e.g., first pixels PX1 and second pixels PX2) may include a pixel circuit PXC and a light emitting element EL connected to the pixel circuit PXC. For example, each of the first pixels PX1 may include the first pixel circuit PXC1 (e.g., the pixel circuit PXC of the first pixel PX1) and a first light emitting element EL1 (e.g., the light emitting element EL of the first pixel PX1) connected to the first pixel circuit PXC1.

The first pixel circuit PXC1 may control the emission time point and luminance of the first light emitting element EL1 by controlling the driving current supplied to the first light emitting element EL1. For example, the first pixel circuit PXC1 may include pixel transistors T and a capacitor Cst that control the driving current in response to at least one scan signal and data signal supplied to the corresponding first pixel PX1. In one embodiment, the pixel transistors T of the first pixel circuit PXC1 may include first to eighth transistors T1 to T8.

The first transistor T1 may include a gate electrode connected to a first node N1, a first electrode connected to the first pixel power line VDL via the fifth transistor T5, and a second electrode connected to the light emitting element EL via the sixth transistor T6. One of the first electrode and the second electrode may be a source electrode and another one may be a drain electrode. The first transistor T1 may control the driving current (e.g., the source-drain current of the first transistor T1) flowing between the first electrode and the second electrode according to the voltage (e.g., the voltage of the first node N1 corresponding to the voltage of the data signal) applied to the gate electrode. For example, the first transistor T1 may be a driving transistor of the first pixel PX1.

The second transistor T2 may include a gate electrode connected to the first scan line SL1, a first electrode connected to the data line DL, and a second electrode connected to the first electrode of the first transistor T1. The second transistor T2 may be turned on by the first scan signal supplied to the first scan line SL1 to connect the first electrode of the first transistor T1 to the data line DL. In case that the second transistor T2 is turned on, the voltage of the data signal supplied to the data line DL may be applied to the first electrode of the first transistor T1.

The third transistor T3 may include a gate electrode connected to the second scan line SL2, a first electrode connected to the second electrode of the first transistor T1, and a second electrode connected to a gate electrode (or the first node N1) of the first transistor T1. The third transistor T3 may be turned on by the second scan signal supplied to the second scan line SL2 to connect the gate electrode of the first transistor T1 to the second electrode. In case that the third transistor T3 is turned on, the first transistor T1 may be driven as a diode.

The fourth transistor T4 may include a gate electrode connected to the third scan line SL3, a first electrode connected to the gate electrode of the first transistor T1, and a second electrode connected to the first initialization power line VIL1. The fourth transistor T4 may be turned on by the third scan signal supplied to the third scan line SL3 to connect the gate electrode of the first transistor T1 to the first initialization power line VIL1. In case that the fourth transistor T4 is turned on, a first initialization voltage VINT1 (e.g., the gate initialization voltage) of the first initialization power line VIL1 may be applied to the gate electrode of the first transistor T1.

The fifth transistor T5 may include a gate electrode connected to the emission control line ECL, a first electrode connected to the first pixel power line VDL, and a second electrode connected to the first electrode of the first transistor T1. The fifth transistor T5 may be turned on by the emission control signal supplied to the emission control line ECL, and thus may connect the first electrode of the first transistor T1 to the first pixel power line VDL to which a first pixel power voltage ELVDD is applied. In case that the fifth transistor T5 is turned on, the first pixel power voltage ELVDD may be applied to the first electrode of the first transistor T1. In one embodiment, the first pixel power voltage ELVDD may be a high potential pixel driving voltage.

The sixth transistor T6 may include a gate electrode connected to the emission control line ECL, the first electrode connected to the second electrode of the first transistor T1, and the second electrode connected to the first light emitting element EL1. The sixth transistor T6 may be turned on by the emission control signal supplied to the emission control line EML to connect the first transistor T1 to the first light emitting element EL1. In case that all of the fifth transistor T5 and the sixth transistor T6 are turned on, the driving current having a magnitude corresponding to the voltage of the gate electrode of the first transistor T1 may flow through the first light emitting element EL1.

The seventh transistor T7 may include a gate electrode connected to the fourth scan line SL4, a first electrode (e.g., an anode electrode) connected to the first electrode of the first light emitting element EL1, and a second electrode connected to the second initialization power line VIL2. The seventh transistor T7 may be turned on by the fourth scan signal supplied to the fourth scan line SLA to connect the first electrode of the first light emitting element EL1 to the second initialization power line VIL2. The fourth scan signal and the first scan signal may be the same signal or different signals. In case that the seventh transistor T7 is turned on, a second initialization voltage VINT2 (e.g., an anode initialization voltage) of the second initialization power line VIL2 may be applied to the first electrode of the first light emitting element EL1.

The eighth transistor T8 may include a gate electrode connected to the fourth scan line SL4, a first electrode connected to the bias power line VOBL, and a second electrode connected to the first electrode of the first transistor T1. The eighth transistor T8 may be turned on by the fourth scan signal supplied to the fourth scan line SL4 to connect the first electrode of the first transistor T1 to the bias power line VOBL. In case that the eighth transistor T8 is turned on, the bias voltage VOBS supplied to the bias power line VOBL may be applied to the first electrode of the first transistor T1. In one embodiment, the bias voltage VOBS may have a voltage level suitable for compensating for the hysteresis characteristic of the first transistor T1. As the eighth transistor T8 is turned on, the first electrode of the first transistor T1 may be initialized to the bias voltage VOBS.

The capacitor Cst may be connected between the gate electrode (or the first node N1) of the first transistor T1 and the first pixel power line VDL. The capacitor Cst may be charged with a voltage corresponding to the voltage of the data signal applied to the gate electrode of the first transistor T1.

The active layer (e.g., a semiconductor pattern including a channel region) of each of the pixel transistors T (e.g., the first to eighth transistors T1 to T8) may include one semiconductor material of polysilicon, amorphous silicon, or an oxide semiconductor. In one embodiment, some of the pixel transistors T and other of the pixel transistors T may be formed of transistors of different conductivity types. Some of the pixel transistors T and other of the pixel transistors T may include different types of semiconductor materials.

For example, the first, second, fifth, sixth, seventh, and eighth transistors T1, T2, T5, T6, T7, and T8 may be formed of P-type transistors (e.g., P-type MOSFETs) including active layers formed of polysilicon, and the third and fourth transistors T3 and T4 may be formed of N-type transistors (e.g., N-type MOSFETs) including active layers formed of an oxide semiconductor. In one embodiment, transistors including active layers formed of polysilicon and transistors including active layers formed of an oxide semiconductor may be disposed on different layers in a circuit layer (e.g., the circuit layer 120 of FIG. 7) of the display panel 100.

However, the disclosure is not limited thereto. For example, the pixel transistors T may be formed of transistors of a same conductivity type. For example, all of the first to eighth transistors T1 to T8 as well as the third and fourth transistors T3 and T4 may be formed of P-type transistors (e.g., P-type MOSFETs) including active layers formed of polysilicon. The type and/or disposition structure, or the like of the pixel transistors T constituting each of the pixel circuits PXC may be variously changed according to embodiments.

The first light emitting element EL1 may be connected between the first pixel circuit PXC1 and the second pixel power line VSL. A second pixel power voltage ELVSS may be applied to the second pixel power line VSL. In one embodiment, the second pixel power voltage ELVSS may be a low potential pixel driving voltage. A potential difference between the first pixel power voltage ELVDD and the second pixel power voltage ELVSS may be greater than or equal to the threshold voltage of the first light emitting element EL1 (or each of the light emitting elements EL). The first light emitting element EL1 may emit light corresponding to the driving current supplied from the first pixel circuit PXC1. For example, the first light emitting element EL1 may be a light source of the first pixel PX1.

In one embodiment, the first pixel PX1 may include a single first light emitting element EL1, but is not limited thereto. For example, the first pixel PX1 may include at least two first light emitting elements EL1.

The first light emitting element EL1 may be an organic light emitting diode, but is not limited thereto. For example, the first light emitting element EL1 may be an inorganic light emitting element, a quantum dot light emitting element, or another type of light emitting element.

Figure 4:
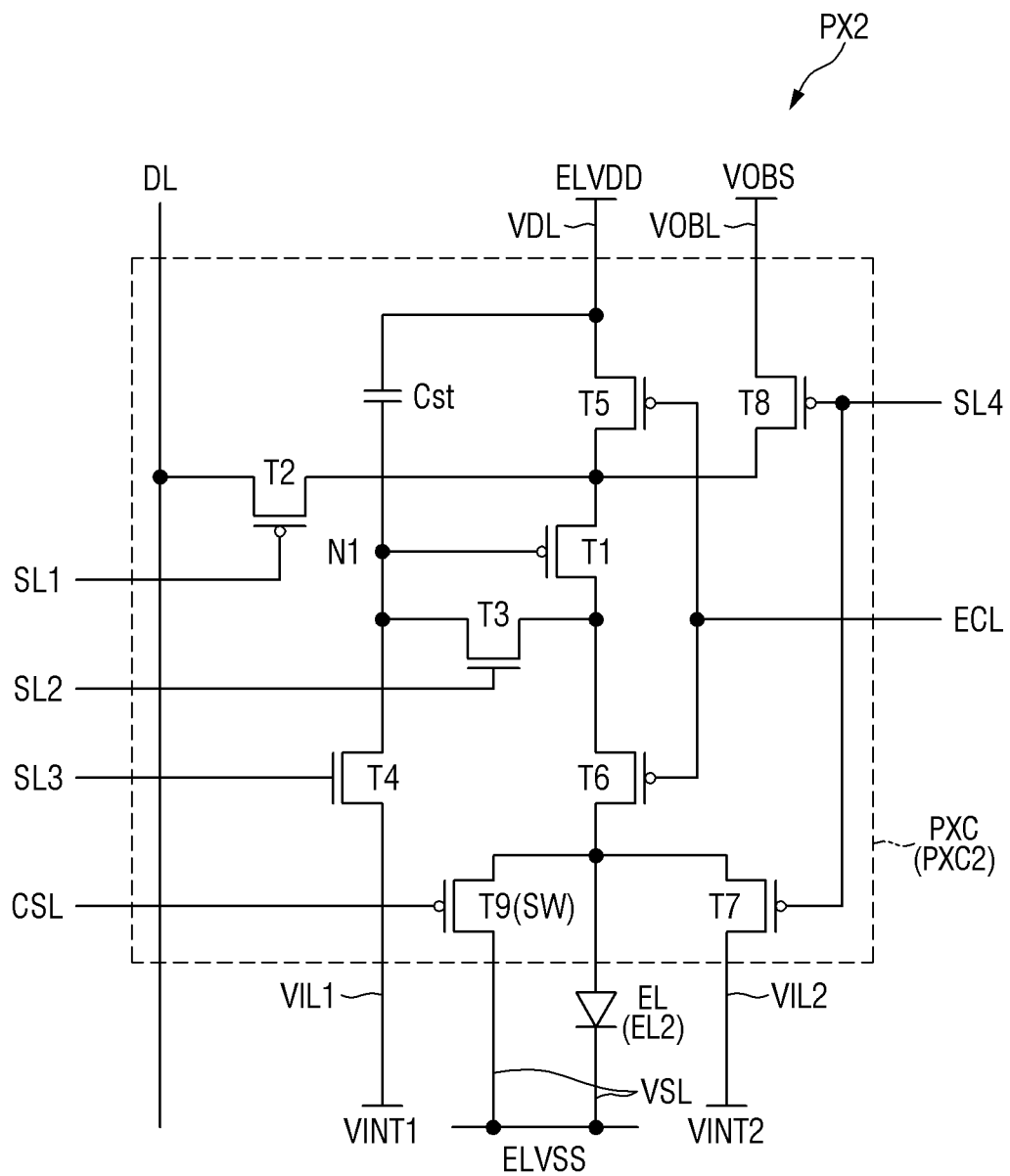
FIG. 4 is a schematic diagram of an equivalent circuit of a second pixel according to one embodiment.
Figure 5:
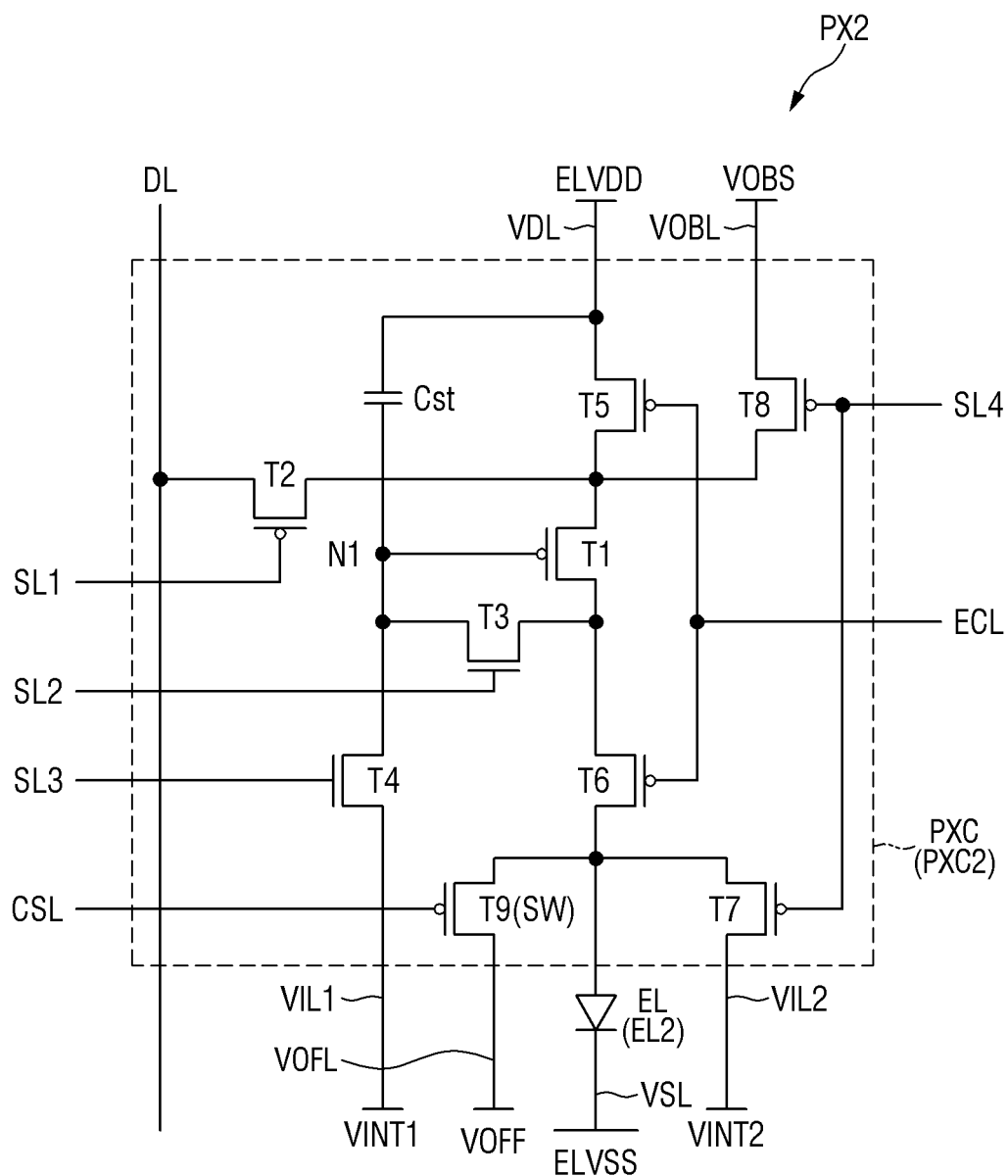
FIG. 5 is a schematic diagram of an equivalent circuit of the second pixel according to one embodiment.

FIG. 4 is a schematic diagram of an equivalent circuit of the second pixel PX2 according to one embodiment. FIG. 5 is a schematic diagram of an equivalent circuit of the second pixel PX2 according to one embodiment. For example, FIGS. 4 and 5 illustrate different embodiments with respect to the power line PL connected to the ninth transistor T9.

Referring to FIGS. 4 and 5 in addition to FIGS. 1 to 3, the second pixel PX2 may include a second pixel circuit PXC2 (e.g., the pixel circuit PXC of the second pixel PX2) and a second light emitting element EL2 (e.g., the light emitting element EL of the second pixel PX2) connected to the second pixel circuit PXC2.

The second pixel circuit PXC2 may have a structure different from a structure of the first pixel circuit PXC1. For example, the second pixel circuit PXC2 may include the pixel transistors T (e.g., the first to eighth transistors T1 to T8) controlling the driving current in response to at least one scan signal and data signal supplied to the corresponding second pixel PX2 and the capacitor Cst, and may further include the switching element SW, for example, a ninth transistor T9, for preventing or blocking the emission of the second pixel PX2 during a period in which the sensor 400 operates. For example, the pixel transistors T of the second pixel circuit PXC2 may include the first to ninth transistors T1 to T9.

Each of the second pixel circuits PXC2 may be further connected to a signal line to which a control signal for controlling the operation of the ninth transistor T9 is applied. For example, the second pixel circuit PXC2 may be further connected to a control signal line CSL to which an off-control signal for turning on the ninth transistor T9 is applied.

In one embodiment, the first pixel PX1 and the second pixel PX2 may be different from the first pixel circuit PXC1 in that the second pixel circuit PXC2 further includes the ninth transistor T9, and the remaining configurations may be substantially the same or similar to each other. For example, each of the first pixels PX1 positioned in the first display area DA1 that does not overlap the sensor area SA may not include the ninth transistor T9, and each of the second pixels PX2 positioned in the second display area DA2 corresponding the sensor area SA may include the ninth transistor T9. During a period in which the sensor 400 operates, the emission of the second pixel PX2 may be independently and/or individually controlled by using the ninth transistor T9.

Multiple second pixels PX2 may be provided and/or disposed in the sensor area SA. The second pixels PX2 may include the power line PL (e.g., the second pixel power line VSL or an off power line VOFL) supplying an off voltage (hereinafter referred to as "an off voltage of the second light emitting element EL2") of a specific level or range, which may prevent or block the emission of the second light emitting elements EL2 when applied to the first electrode of each of the second light emitting elements EL2, and each of the switching elements SW, for example, each of the ninth transistors T9, connected between the respective second light emitting elements EL2. Each of the ninth transistors T9 may be turned on by an off-control signal supplied to the control signal line CSL (or fifth scan line).

During a period in which the sensor 400 operates, the emission of the second pixels PX2 may be independently and/or individually controlled by using the ninth transistors T9. For example, the driving circuit 310 may supply an off-control signal that turns on each of the ninth transistors T9 to the second pixels PX2 through the control signal line CSL during a period in which the sensor 400 operates. In case that the ninth transistors T9 of the second pixels PX2 are turned on, an off voltage may be transmitted to the first electrode of the second light emitting element EL2 of each of the second pixels PX2. Accordingly, during a period in which the sensor 400 operates, the second light emitting elements EL2 of the second pixels PX2 may be prevented from emitting light in an unintended form by the off-control signal supplied to the second pixels PX2.

The first to eighth transistors T1 to T8 of the second pixel circuit PXC2 may be elements corresponding to the first to eighth transistors T1 to T8 of the first pixel circuit PXC1. For example, the first to eighth transistors T1 to T8 of the second pixel circuit PXC2 and the first to eighth transistors T1 to T8 of the first pixel circuit PXC1 may be substantially the same, respectively. Accordingly, redundant descriptions of the first to eighth transistors T1 to T8 of the second pixel circuit PXC2 will be omitted.

The ninth transistor T9 may be connected between the power line PL supplying the off voltage of the second light emitting element EL2 and the second light emitting element EL2 and may be turned on by an off-control signal applied to the control signal line CSL (also referred to as a "signal line" or "fifth scan line"). For example, the ninth transistor T9 may include a gate electrode connected to the control signal line CSL, a first electrode connected to the first electrode (e.g., an anode electrode) of the second light emitting element EL2, and a second electrode connected to the power line PL supplying the off voltage of the second light emitting element EL2.

In one embodiment, the second electrode of the ninth transistor T9 may be connected to the second pixel power line VSL as illustrated in FIG. 4. In another embodiment, the second electrode of the ninth transistor T9 may be connected to the separate power line PL, for example, the off power line VOFL, as illustrated in FIG. 5.

The off power line VOFL may be a separate power line separated from the power lines PL (e.g., the first and second pixel power lines VDL and VSL, the first and second initialization power lines VIL1 and VIL2, and the bias power line VOBL) commonly connected to the first pixels PX1 and the second pixels PX2. An off voltage VOFF may be applied to the off power line VOFL.

The off voltage VOFF may have a voltage level suitable for controlling the second light emitting element EL2 not to emit light. For example, the off voltage VOFF may be a constant voltage (e.g., a DC voltage) having a voltage value substantially the same as or similar to the second pixel power voltage ELVSS. For example, a potential difference between the off voltage VOFF and the second pixel power voltage ELVSS may be smaller than the threshold voltage of the second light emitting element EL2 (or each of the light emitting elements EL).

In one embodiment, the ninth transistor T9 may be formed of a P-type transistor (e.g., a P-type MOSFET) including an active layer formed of polysilicon, but is not limited thereto.

For example, the ninth transistor T9 may be formed of an N-type transistor (e.g., an N-type MOSFET).

The first electrode of the second light emitting element EL2 may be connected to the second electrode of the sixth transistor T6, the first electrode of the seventh transistor T7, and the first electrode of the ninth transistor T9. The second electrode of the second light emitting element EL2 may be connected to the second pixel power line VSL.

The ninth transistor T9 may be turned on by the off-control signal supplied to the control signal line CSL and may connect the first electrode of the second light emitting element EL2 to the second pixel power line VSL or the off power line VOFL. In case that the ninth transistor T9 is turned on, the second pixel power voltage ELVSS or the off voltage VOFF may be applied to the first electrode of the second light emitting element EL2. Accordingly, during a period in which the off-control signal is supplied to the second pixel PX2, the second light emitting element EL2 may maintain a non-emission state.

In one embodiment, the second pixels PX2 provided in the sensor area SA may have substantially the same or similar structure. For example, the second pixels PX2 may include the respective switching elements SW, for example, the respective ninth transistors T9.

In one embodiment, the ninth transistors T9 of the second pixels PX2 may be supplied with an off-control signal substantially simultaneously during a period in which the sensor 400 operates, and may simultaneously be turned on by the off-control signal. For example, the gate electrodes of the ninth transistors T9 provided in the second pixels PX2 may be commonly connected to the control signal line CSL, and the second electrodes of the ninth transistors T9 may be commonly connected to the second pixel power line VSL or the off power line VOFL. Accordingly, the second pixels PX2 may simultaneously maintain a non-emission state during a period in which the off-control signal of the gate-on voltage is supplied to the control signal line CSL.

Figure 6:
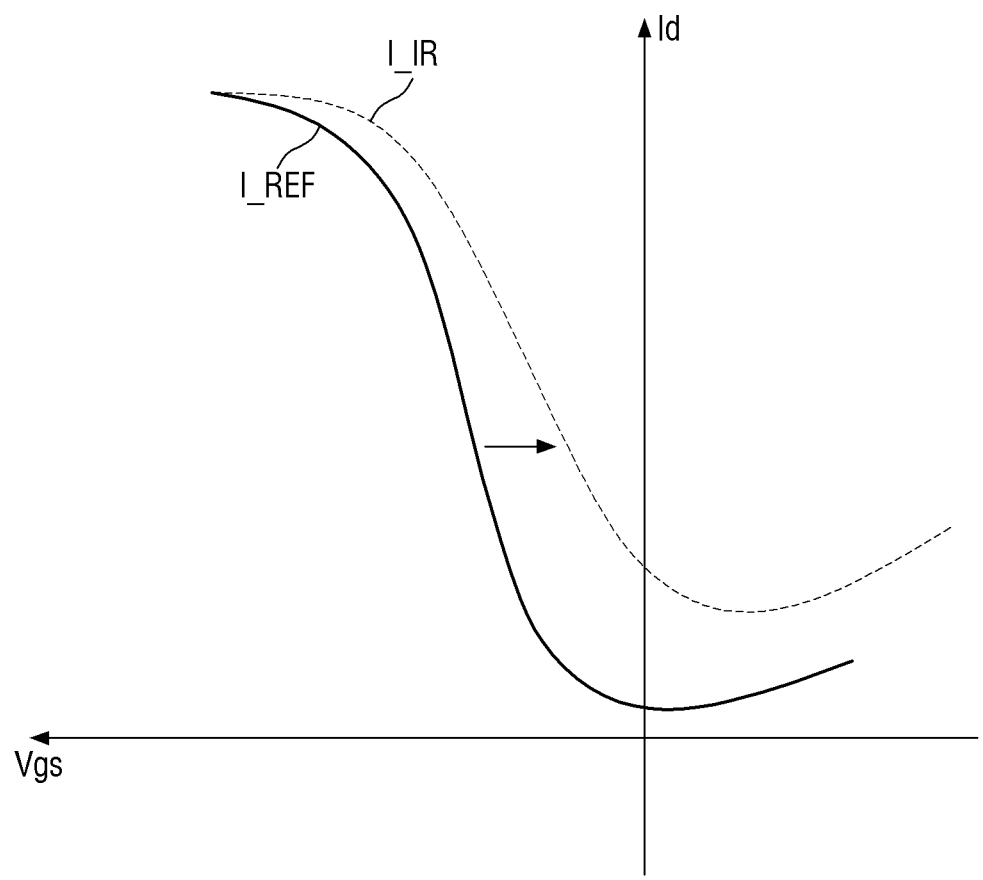
FIG. 6 is a graph illustrating characteristic changes of a pixel transistor according to one embodiment.

FIG. 6 is a graph illustrating characteristic changes of the pixel transistor T according to one embodiment. For example, FIG. 6 is a graph schematically illustrating a change in a drain current Id according to a gate-source voltage Vgs of a P-type transistor by infrared irradiation.

Referring to FIG. 6 in addition to FIGS. 1 to 5, in case that the P-type transistor is irradiated with infrared light, the drain current Id according to the gate-source voltage Vgs may be changed. For example, the P-type transistor may exhibit a current characteristic as in the shape of a first current curve I_REF in case that infrared rays are not irradiated, and may exhibit a current characteristic in which the drain current Id increases as in the shape of a second current curve I_IR in case that infrared rays are irradiated.

Accordingly, in the case of the second pixels PX2 positioned in the second display area DA2 corresponding to the sensor area SA, as the infrared rays are emitted according to the operation of the sensor 400, the characteristic of the P-type transistor (e.g., the first, second, fifth, sixth, seventh, eighth, and/or ninth transistors T1, T2, T5, T6, T7, T8, and/or T9) included in the second pixels PX2 may change. Accordingly, during a period in which the sensor 400 operates, the second pixels PX2 may emit light with an unintended luminance, which may be visually recognized as a screen defect such as stain or flicker in the display area DA.

However, in embodiments, during a period (e.g., a sensing period in which the sensor 400 operates and emits infrared rays in a call situation or the like) in which the sensor 400 operates, an off-control signal may be supplied from the driving circuit 310 to the second pixels PX2, so that the ninth transistors T9 of the second pixels PX2 may be turned on. Accordingly, the second pixels PX2 may be controlled not to emit light in an abnormal manner during a period in which the sensor 400 operates.

In embodiments, the second pixels PX2 may be turned off (or non-emitted) separately from the operation of the first pixels PX1 by using the off-control signal. Accordingly, only the second display area DA2 may be selectively turned off as needed during a period in which the sensor 400 operates or the like, and a desired image may be displayed by the first pixels PX1 in the first display area DA1. Since the emission of the second pixels PX2 may be individually controlled without simultaneously controlling the pixels PX of each horizontal line, the emission of the pixels PX positioned in the display area DA without forming a separate scan driver or the like may be more locally controlled. Accordingly, the display device 10 may be readily controlled in more various forms, and user convenience may be enhanced.

Figure 7:
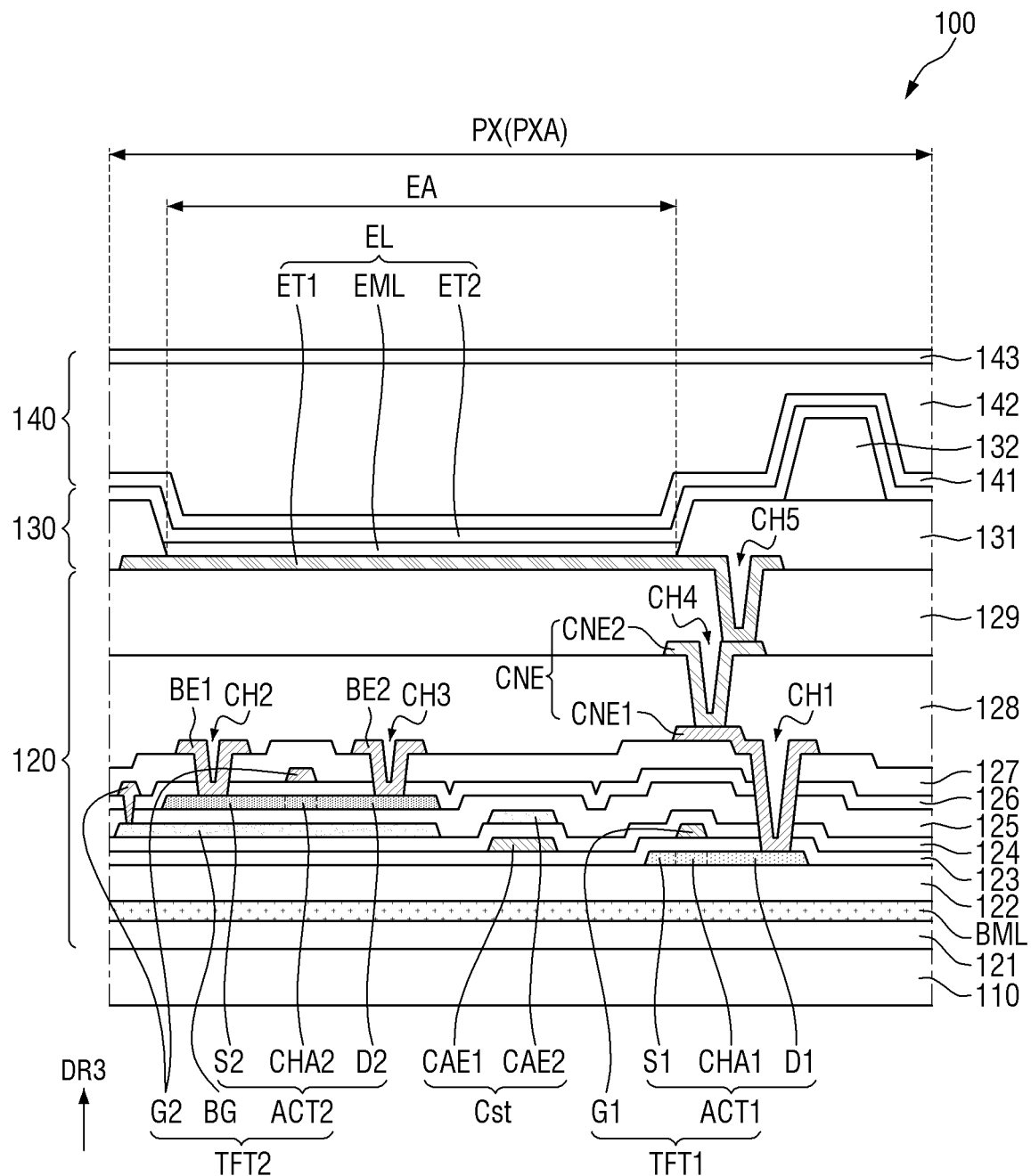
FIG. 7 is a schematic cross-sectional view illustrating a display panel according to one embodiment.

FIG. 7 is a schematic cross-sectional view illustrating the display panel 100 according to one embodiment. For example, FIG. 7 schematically illustrates a cross section of a part of the display area DA corresponding to a pixel area PXA in which one pixel PX is positioned.

Referring to FIG. 7 in addition to FIGS. 1 to 6, the display panel 100 may include the substrate 110, the circuit layer 120, the light emitting element layer 130, and the encapsulation layer 140 disposed on the substrate 110. The circuit layer 120, the light emitting element layer 130, and the encapsulation layer 140 may be sequentially arranged or stacked on the substrate 110 in the third direction DR3.

The substrate 110 may be a base member for forming the display panel 100 and may include the main region MA including the display area DA and the non-display area NA, and the sub-region SBA positioned on a side of the main region MA. The substrate 110 may be made of a material having a flexible characteristic capable of bending, folding, rolling, or the like. The substrate 110 may be formed of an insulating material such as a polymer resin. For example, the substrate 110 may be made of polyimide.

The circuit layer 120 may include the pixel circuits PXC including the first pixel circuit PXC1 and the second pixel circuit PXC2 and wires. For example, the circuit layer 120 may include circuit elements (e.g., the pixel transistors T and the capacitor Cst) constituting the pixel circuit PXC (e.g., the first pixel circuit PXC1 or the second pixel circuit PXC2) of each of the pixels PX, and wires (e.g., the power lines PL, the scan lines SL, the emission control lines ECL, the data lines DL, and various power lines and signal lines including at least one control signal line CSL) connected to the pixels PX. In one embodiment, the circuit layer 120 may be formed entirely on a surface of the substrate 110, including the main region MA and the sub-region SBA.

Among elements that may be provided on the circuit layer 120, FIG. 7 illustrates a first thin film transistor TFT1 (also referred to as a "first pixel transistor") provided in the pixel area PXA of each of the pixels PX, a second thin film transistor TFT2 (also referred to as a "second pixel transistor"), and a capacitor Cst. In one embodiment, the first thin film transistor TFT1 may be first type transistors (e.g., P-type transistors) including a first semiconductor material (e.g., polysilicon) among the pixel transistors T constituting each of the pixel circuits PXC. For example, the first thin film transistor TFT1 may be one of the first, second, fifth, sixth, seventh, eighth, and/or ninth transistors T1, T2, T5, T6, T7, T8, and/or T9. FIG. 7 illustrates, as the first thin film transistor TFT1, one transistor (e.g., the sixth transistor T6 of FIGS. 3 to 5) connected to the light emitting element EL (e.g., the first light emitting element EL1 or the second light emitting element EL2) through at least one connection electrode CNE (e.g., a first connection electrode CNE1 and a second connection electrode CNE2) among the first type transistors. In one embodiment, the second thin film transistor TFT2 may be second type transistors (e.g., N-type transistors) including a second semiconductor material (e.g., oxide semiconductor) among the pixel transistors T. For example, the second thin film transistor TFT2 may be one of the third and fourth transistors T3 or T4.

Cross sections of the pixels PX may be variously changed according to each of the pixels PX and the type and/or structure of the display panel 100 including the pixel PX. For example, positions and order of formation of the first thin film transistor TFT1, the second thin film transistor TFT2, and the capacitor Cst may vary according to embodiments.

The circuit layer 120 may include semiconductor layers for forming circuit elements, wires, or the like, conductive layers, and insulating layers disposed between and/or around the semiconductor layers and the conductive layers. For example, the circuit layer 120 may include a first semiconductor layer SCL1 (e.g., a polysilicon semiconductor layer), a first insulating layer 123 (e.g., a first gate insulating layer), a first conductive layer CDL1 (e.g., a first gate conductive layer), a second insulating layer 124 (e.g., a second gate insulating layer), a second conductive layer CDL2 (e.g., a second gate conductive layer), a third insulating layer 125 (e.g., a first interlayer insulating layer), a second semiconductor layer SCL2 (e.g., an oxide semiconductor layer), a fourth insulating layer 126 (e.g., a third gate insulating layer), a third conductive layer CDL3 (e.g., a third gate conductive layer), a fifth insulating layer 127 (e.g., a second interlayer insulating layer), a fourth conductive layer CDL4 (e.g., a first source-drain conductive layer), a sixth insulating layer 128 (e.g., a first via layer or a first planarization layer), a fifth conductive layer CDL5 (e.g., a second source-drain conductive layer), and a seventh insulating layer 129 (e.g., a second via layer or a second planarization layer) sequentially disposed on the substrate 110 in the third direction DR3. In one embodiment, the circuit layer 120 may further include a lower conductive layer BCDL disposed between the substrate 110 and the first semiconductor layer SCL1, a barrier layer 121 disposed between the substrate 110 and the lower conductive layer BCDL, and a buffer layer 122 disposed between the lower conductive layer BCDL and the first semiconductor layer SCL1.

The barrier layer 121 may be disposed on the substrate 110. The barrier layer 121 may protect elements disposed on the circuit layer 120 and the light emitting element layer 130 from moisture permeating through the substrate 110 that may be susceptible to moisture permeation. The barrier layer 121 may include at least one inorganic layer containing an inorganic insulating material (e.g., silicon nitride, silicon oxide, silicon oxynitride, titanium oxide, aluminum oxide, or another inorganic insulating material). The material of the barrier layer 121 may be variously changed according to embodiments.

The lower conductive layer BCDL may be disposed on the barrier layer 121. The lower conductive layer BCDL may include a lower metal layer BML overlapping the active layer (e.g., a first active layer ACT1 and/or a second active layer ACT2) of the at least one pixel transistor T in a plan view, and/or at least one wire (or a part of the at least one wire). Although FIG. 7 illustrates that the lower metal layer BML is entirely disposed in the pixel area PXA, the disclosure is not limited thereto. For example, the lower metal layer BML may be patterned in an appropriate size and/or shape as needed and positioned only in a part of the pixel area PXA. For example, the lower metal layer BML may be positioned only in a part of the pixel area PXA to be positioned below the first transistor T1 illustrated in FIGS. 3 to 5. In one embodiment, the lower metal layer BML may also be utilized as a light blocking pattern and/or a back-gate electrode of at least one pixel transistor T, or the like.

The buffer layer 122 may be disposed on the lower conductive layer BCDL to cover the lower conductive layer BCDL. The buffer layer 122 may include at least one inorganic layer containing an inorganic insulating material.

The first thin film transistor TFT1, the second thin film transistor TFT2, and the capacitor Cst may be disposed on a surface of the substrate 110 including the buffer layer 122. The first thin film transistor TFT1 may include the first active layer ACT1 and a first gate electrode G1. The second thin film transistor TFT2 may include the second active layer ACT2 and a second gate electrode G2. In one embodiment, the second thin film transistor TFT2 may further include a back-gate electrode BG. The capacitor Cst may include a first capacitor electrode CAE1 and a second capacitor electrode CAE2.

For example, the first semiconductor layer SCL1 may be disposed on the buffer layer 122. The first semiconductor layer SCL1 may include the first active layer ACT1 of the first thin film transistor TFT1. For example, the first semiconductor layer SCL1 may include the first active layer ACT1 corresponding to each of the first, second, fifth, sixth, seventh, eighth, and/or ninth transistors T1, T2, T5, T6, T7, T8, and/or T9.

The first active layer ACT1 may be provided in the first semiconductor layer SCL1 and may include a first semiconductor material (e.g., polysilicon). The first active layer ACT1 may include a first channel region CHA1, a first source region S1, and a first drain region D1. The first channel region CHA1 may overlap the first gate electrode G1 in the third direction DR3. The first source region S1 may be disposed on a side of the first channel region CHA1, and the first drain region D1 may be disposed on another side of the first channel region CHA1. The first source region S1 and the first drain region D1 may be regions formed to have conductivity by doping ions or impurities into a semiconductor for forming the first active layer ACT1. In one embodiment, the first source region S1 may be a source electrode of the first thin film transistor TFT1. In another embodiment, the first thin film transistor TFT1 may include a separate source electrode connected to the first source region S1. In one embodiment, the first drain region D1 may be a drain electrode of the first thin film transistor TFT1. In another embodiment, the first thin film transistor TFT1 may include a separate drain electrode connected to the first drain region D1.

The first insulating layer 123 may be disposed on the first semiconductor layer SCL1. The first insulating layer 123 may cover the first semiconductor layer SCL1.

The first conductive layer CDL1 may be disposed on the first insulating layer 123. The first conductive layer CDL1 may include the first gate electrode G1 of the first thin film transistor TFT1. The first gate electrode G1 may be provided on the first conductive layer CDL1 to overlap a part of the first active layer ACT1 (e.g., the first channel region CHA1) in a plan view. In one embodiment, the first conductive layer CDL1 may further include at least one wire (or a part of the at least one wire), a conductive pattern (e.g., a bridge pattern), and/or a capacitor electrode. For example, the first conductive layer CDL1 may further include the first capacitor electrode CAE1 of the capacitor Cst.

In one embodiment, the first capacitor electrode CAE1 may be integrally formed with the gate electrode of at least one first thin film transistor TFT1. For example, the first capacitor electrode CAE1 may be integrally formed with the gate electrode of the first transistor T1 illustrated in FIGS. 3 to 5. For example, the first capacitor electrode CAE1 and the gate electrode of the first transistor T1 may be formed as one conductive pattern, and the second capacitor electrode CAE2 may be disposed to overlap the conductive pattern in a plan view.

The second insulating layer 124 may be disposed on the first conductive layer CDL1. The second insulating layer 124 may cover the first conductive layer CDL1.

The second conductive layer CDL2 may be disposed on the second insulating layer 124. The second conductive layer CDL2 may include one electrode of the capacitor Cst, for example, the second capacitor electrode CAE2. In one embodiment, the second conductive layer CDL2 may further include at least one electrode, a wire (or a part of the at least one wire), and/or a conductive pattern (e.g., a bridge pattern). For example, the second conductive layer CDL2 may further include the back-gate electrode BG connected to the second gate electrode G2 of the second thin film transistor TFT2.

The third insulating layer 125 may be disposed on the second conductive layer CDL2. The third insulating layer 125 may cover the second conductive layer CDL2.

The second semiconductor layer SCL2 may be disposed on the third insulating layer 125. The second semiconductor layer SCL2 may include the second active layer ACT2 of the second thin film transistor TFT2. For example, the second semiconductor layer SCL2 may include the second active layer ACT2 corresponding to each of the third and fourth transistors T3 and T4.

The second active layer ACT2 may be provided in the second semiconductor layer SCL2 and may include a second semiconductor material (e.g., an oxide semiconductor) different from the first semiconductor material. For example, the second active layer ACT2 may include IGZO (indium (In), gallium (Ga), zinc (Zn) and oxygen (O)), IGZTO (indium (In), gallium (Ga), zinc (Zn), tin (Sn) and oxygen (O)), or IGTO (indium (In), gallium (Ga), tin (Sn), and oxygen (O)).

The second active layer ACT2 may include a second channel region CHA2, a second source region S2, and a second drain region D2. The second channel region CHA2 may overlap the second gate electrode G2 in the third direction DR3. The second source region S2 may be disposed on a side of the second channel region CHA2, and the second drain region D2 may be disposed on another side of the second channel region CHA2. The second source region S2 and the second drain region D2 may be conductive regions by doping ions or impurities into a semiconductor for forming the second active layer ACT2. In one embodiment, the second source region S2 may be a source electrode of the second thin film transistor TFT2. In another embodiment, the second thin film transistor TFT2 may include a separate source electrode connected to the second source region S2. In one embodiment, the second drain region D2 may be a drain electrode of the second thin film transistor TFT2. In another embodiment, the second thin film transistor TFT2 may include a separate drain electrode connected to the second drain region D2.

The fourth insulating layer 126 may be disposed on the second semiconductor layer SCL2. The fourth insulating layer 126 may cover the second semiconductor layer SCL2.

The third conductive layer CDL3 may be disposed on the fourth insulating layer 126. The third conductive layer CDL3 may include the second gate electrode G2 of the second thin film transistor TFT2. The second gate electrode G2 may be provided on the third conductive layer CDL3 to overlap a part (e.g., the second channel region CHA2) of the second active layer ACT2 in a plan view. In one embodiment, the third conductive layer CDL3 may further include at least one wire (or a part of the at least one wire), a conductive pattern (e.g., a bridge pattern), and/or a capacitor electrode.

In one embodiment, each of the electrodes, the conductive patterns, and/or the wires provided on the lower conductive layer BCDL, the first conductive layer CDL1, the second conductive layer CDL2, and the third conductive layer CLD3 may include a conductive material (e.g., molybdenum (Mo), aluminum (Al), chromium (Cr), gold (Au), titanium (Ti), nickel (Ni), neodymium (Nd), copper (Cu), the like, alloys thereof, or other conductive materials), and each may have a single layer or multilayer structure. For example, each of the electrodes, the conductive patterns, and/or the wires provided in the lower conductive layer BCDL, the first conductive layer CDL1, the second conductive layer CDL2, and the third conductive layer CLD3 may include molybdenum (Mo) or another metal. At least two conductive layers among the lower conductive layer BCDL, the first conductive layer CDL1, the second conductive layer CDL2, and the third conductive layer CLD3 may include a same material or may include different materials. Materials of each of the lower conductive layer BCDL, the first conductive layer CDL1, the second conductive layer CDL2, and the third conductive layer CLD3 are not limited, and may be variously changed according to embodiments.

The fifth insulating layer 127 may be disposed on the third conductive layer CDL3. The fifth insulating layer 127 may cover the third conductive layer CDL3.

In one embodiment, the first insulating layer 123, the second insulating layer 124, the third insulating layer 125, the fourth insulating layer 126, and the fifth insulating layer 127 may be an inorganic insulating layer including an inorganic insulating material (e.g., silicon nitride, silicon oxide, silicon oxynitride, titanium oxide, aluminum oxide, or another inorganic insulating material), and each may have a single layer or multilayer structure. At least two insulating layers among the first insulating layer 123, the second insulating layer 124, the third insulating layer 125, the fourth insulating layer 126, and the fifth insulating layer 127 may include a same material or may include different materials. Materials of each of the first insulating layer 123, the second insulating layer 124, the third insulating layer 125, the fourth insulating layer 126, and the fifth insulating layer 127 may be variously changed according to embodiments.

The fourth conductive layer CDL4 may be disposed on the fifth insulating layer 127. The fourth conductive layer CDL4 may include the first connection electrode CNE1 (or a drain electrode of the first thin film transistor TFT1), a first bridge electrode BE1 (or a source electrode of the second thin film transistor TFT2), and a second bridge electrode BE2 (or a drain electrode of the second thin film transistor TFT2). The first connection electrode CNE1 may be provided in the fourth conductive layer CDL4 and may be connected to the first drain region D1 of the first active layer ACT1 through a contact hole CH (e.g., a first contact hole CH1) penetrating the first insulating layer 123, the second insulating layer 124, the third insulating layer 125, the fourth insulating layer 126, and the fifth insulating layer 127. The first bridge electrode BE1 may be provided in the fourth conductive layer CDL4 and may be connected to the second source region S2 of the second active layer ACT2 through the contact hole CH (e.g., a second contact hole CH2) penetrating the fourth insulating layer 126 and the fifth insulating layer 127. The second bridge electrode BE2 may be connected to the second drain region D2 of the second active layer ACT2 through the contact hole CH (e.g., a third contact hole CH3) penetrating the fourth insulating layer 126 and the fifth insulating layer 127. In one embodiment, the fourth conductive layer CDL4 may further include at least one wire (or a part of the at least one wire), and/or a conductive pattern (e.g., a bridge pattern). For example, the fourth conductive layer CDL4 may include a part of the power line PL (e.g., the first pixel power line VDL and/or the second pixel power line VSL) provided inside and/or outside the display area DA.

The sixth insulating layer 128 may be disposed on the fourth conductive layer CDL4. The sixth insulating layer 128 may cover the fourth conductive layer CDL4.

The fifth conductive layer CDL5 may be disposed on the sixth insulating layer 128. The fifth conductive layer CDL5 may include the second connection electrode CNE2. The second connection electrode CNE2 may be provided in the fifth conductive layer CDL5 and may be connected to the first connection electrode CNE1 through the contact hole CH (e.g., a fourth contact hole CH4 (or a first via hole)) penetrating the sixth insulating layer 128. In one embodiment, the fifth conductive layer CDL5 may further include at least one wire (or a part of the at least one wire), and/or a conductive pattern (e.g., a bridge pattern). For example, the fifth conductive layer CDL5 may include a part of the power line PL (e.g., the first pixel power line VDL and/or the second pixel power line VSL) provided inside and/or outside the display area DA.

In one embodiment, each of the electrodes, the conductive patterns, and/or the wires provided in the fourth conductive layer CDL4 and the fifth conductive layer CDL5 may include a conductive material (e.g., molybdenum (Mo), aluminum (Al), chromium (Cr), gold (Au), titanium (Ti), nickel (Ni), neodymium (Nd), copper (Cu), the like, alloys thereof, or other conductive materials), and may have a single layer or multilayer structure. For example, each of the electrodes, the conductive patterns, and/or the wires provided in the fourth conductive layer CDL4 and the fifth conductive layer CDL5 may be formed of a triple layer structure of titanium/aluminum/titanium (Ti/Al/Ti). The fourth conductive layer CDL4 and the fifth conductive layer CDL5 may include a same material or may include different materials. Materials of each of the fourth conductive layer CDL4 and the fifth conductive layer CDL5 may be variously changed according to embodiments.

The seventh insulating layer 129 may be disposed on the fifth conductive layer CDL5. The seventh insulating layer 129 may cover the fifth conductive layer CDL5.

In one embodiment, the sixth insulating layer 128 and the seventh insulating layer 129 may be an organic insulating layer including an organic insulating material (e.g., an acrylic resin, an epoxy resin, a phenolic resin, a polyamide resin, a polyimide resin, or the like) to planarize the circuit layer 120, and each may have a single layer or multilayer structure. The sixth insulating layer 128 and the seventh insulating layer 129 may include a same material or may include different materials. Materials of each of the sixth insulating layer 128 and the seventh insulating layer 129 may be variously changed according to embodiments.

The light emitting element layer 130 may be disposed on the circuit layer 120 and may be positioned in the display area DA. For example, the light emitting element layer 130 may be disposed on the circuit layer 120 in the display area DA.

The light emitting element layer 130 may include the light emitting elements EL of the pixels PX including the first light emitting element EL1 and the second light emitting element EL2. For example, the light emitting element layer 130 may include the pixel defining layer 131 that partitions emission areas EA of the pixels PX and the respective light emitting elements EL positioned in the respective emission areas EA. In one embodiment, the light emitting element layer 130 may further include a spacer 132 disposed on a part of the pixel defining layer 131.

Each of the light emitting elements EL may include a first electrode ET1 (e.g., an anode electrode) connected to at least one transistor T (e.g., the first thin film transistor TFT1) included in the corresponding pixel PX through at least one connection electrode CNE, and the light emitting layer EML and a second electrode ET2 (e.g., a cathode electrode) sequentially disposed on the first electrode ET1. In one embodiment, the light emitting element EL may further include a first intermediate layer (e.g., hole layer including a hole transport layer) interposed between the first electrode ET1 and the light emitting layer EML, and a second intermediate layer (e.g., an electron layer including an electron transport layer) interposed between the light emitting layer EML and the second electrode ET2.

The first electrode ET1 of the light emitting element EL may include a conductive material and may be disposed on the circuit layer 120. For example, the first electrode ET1 may be disposed on the seventh insulating layer 129 to correspond to each emission area EA. The first electrode ET1 may be connected to the second connection electrode CNE2 through the contact hole CH (e.g., a fifth contact hole CH5 (or a second via hole)) penetrating the seventh insulating layer 129.

In one embodiment, the first electrode ET1 may include a metallic material having high reflectivity. For example, the first electrode ET1 may have a single-layer structure including molybdenum (Mo), titanium (Ti), copper (Cu) or aluminum (Al), or may have a multilayer structure (e.g., ITO/Mg, ITO/MgF, ITO/Ag, and ITO/Ag/ITO) including indium-tin-oxide (ITO), indium-zinc-oxide (IZO), zinc oxide (ZnO), indium oxide ($In_2O_3$), silver (Ag), magnesium (Mg), aluminum (Al), platinum (Pt), lead (Pb), gold (Au), or nickel (Ni).

The light emitting layer EML of the light emitting element EL may include a high molecular material or a low molecular material. Light emitted from the light emitting layer EML may contribute to image display. In one embodiment, the light emitting layer EML may be provided for each pixel PX, and the light emitting layer EML of each pixel PX may emit visible light of a color corresponding to the corresponding pixel PX. In another embodiment, the light emitting layer EML may be a common layer shared by pixels PX of different colors, and a wavelength conversion layer and/or color filters corresponding to the color (or wavelength band) of light desired to be emitted from each pixel PX may be arranged in the emission areas EA of at least some of the pixels PX.

The second electrode ET2 of the light emitting element EL may include a conductive material and may be connected to the second pixel power line VSL. In one embodiment, the second electrode ET2 may be a common layer formed across the entire display area DA to cover the light emitting layer EML and the pixel defining layer 131. In one embodiment, the second electrode ET2 may be formed of a transparent conductive material (TCO) such as ITO or IZO capable of transmitting light or a semi-transmissive conductive material such as magnesium (Mg), silver (Ag), or an alloy of magnesium (Mg) and silver (Ag). In case that the second electrode ET2 is made of a semi-transmissive conductive material, an improvement in light output efficiency due to a micro cavity effect may be expected.

The pixel defining layer 131 may have an opening corresponding to each of the emission areas EA and may surround the emission areas EA in a plan view. For example, the pixel defining layer 131 may be formed to cover an edge of the first electrode ET1 of the light emitting element EL and may include an opening exposing the remaining portion of the first electrode ET1. A region where the exposed first electrode ET1 and the light emitting layer EML overlap (or a region including the same) may be defined as the emission area EA of each pixel PX.

In one embodiment, the pixel defining layer 131 may include at least one organic layer containing an organic insulating material. For example, the pixel defining layer 131 may include an acrylic resin, an epoxy resin, a phenolic resin, a polyamide resin, a polyimide resin, an unsaturated polyester resin, a polyphenylene ether resin, a polyphenylenesulfide resin, benzocyclobutene (BCB), or the like.

The spacer 132 may be disposed on a part of the pixel defining layer 131. The spacer 132 may include at least one organic layer containing an organic insulating material. The spacer 132 and the pixel defining layer 131 may include a same material or may include different materials. In one embodiment, the pixel defining layer 131 and the spacer 132 may be sequentially formed through separate mask processes. In another embodiment, the pixel defining layer 131 and the spacer 132 may be simultaneously formed using a halftone mask, and the pixel defining layer 131 and the spacer 132 may be a single insulating layer that is integral with each other. The organic insulating material constituting the spacer 132 is not particularly limited and may be variously changed according to embodiments.

The encapsulation layer 140 may be disposed on the light emitting element layer 130 in the main region MA. For example, the encapsulation layer 140 may be disposed in the display area DA and the non-display area NA to cover the light emitting element layer 130. The encapsulation layer 140 may block the permeation of oxygen or moisture into the light emitting element layer 130, and may reduce electrical and/or physical impacts to the circuit layer 120 and the light emitting element layer 130.

In one embodiment, the encapsulation layer 140 may include a first inorganic encapsulation layer 141, an organic encapsulation layer 142, and a second inorganic encapsulation layer 143 sequentially disposed on the light emitting element layer 130. The first inorganic encapsulation layer 141 and the second inorganic encapsulation layer 143 may include an inorganic material, and the organic encapsulation layer 142 may include an organic material.

In one embodiment, the organic encapsulation layer 142 may be prepared by dropping an organic material in a liquid state onto the first inorganic encapsulation layer 141, spreading it to cover the display area DA, and curing it. The display panel 100 may further include at least one dam for limiting the diffusion range of the organic material of the organic encapsulation layer 142. The dam may be disposed in the non-display area NA adjacent to the display area DA so as to surround the display area DA in a plan view.

Figure 8:
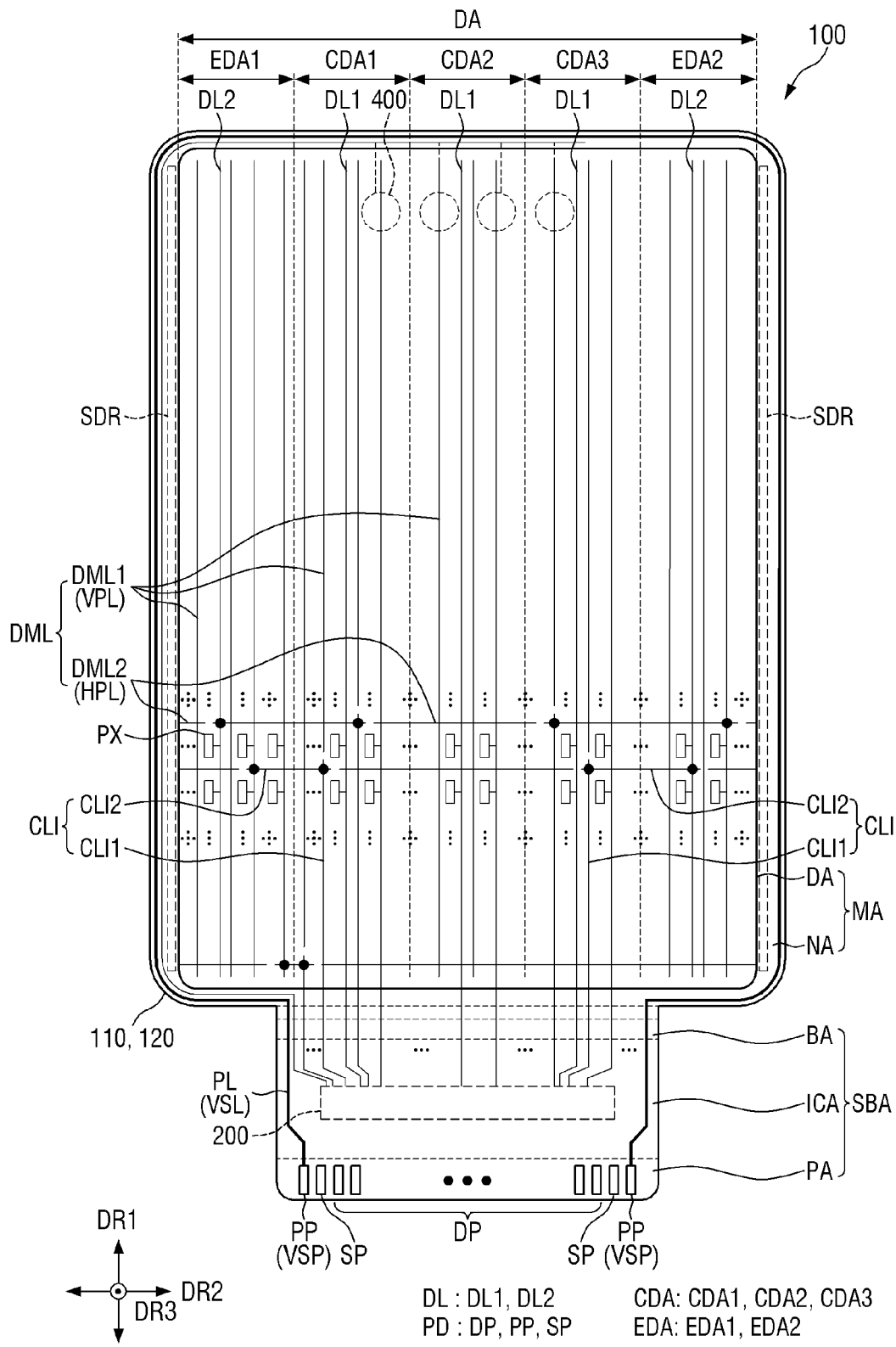
FIG. 8 is a plan view illustrating the display panel according to one embodiment.
Figure 9:
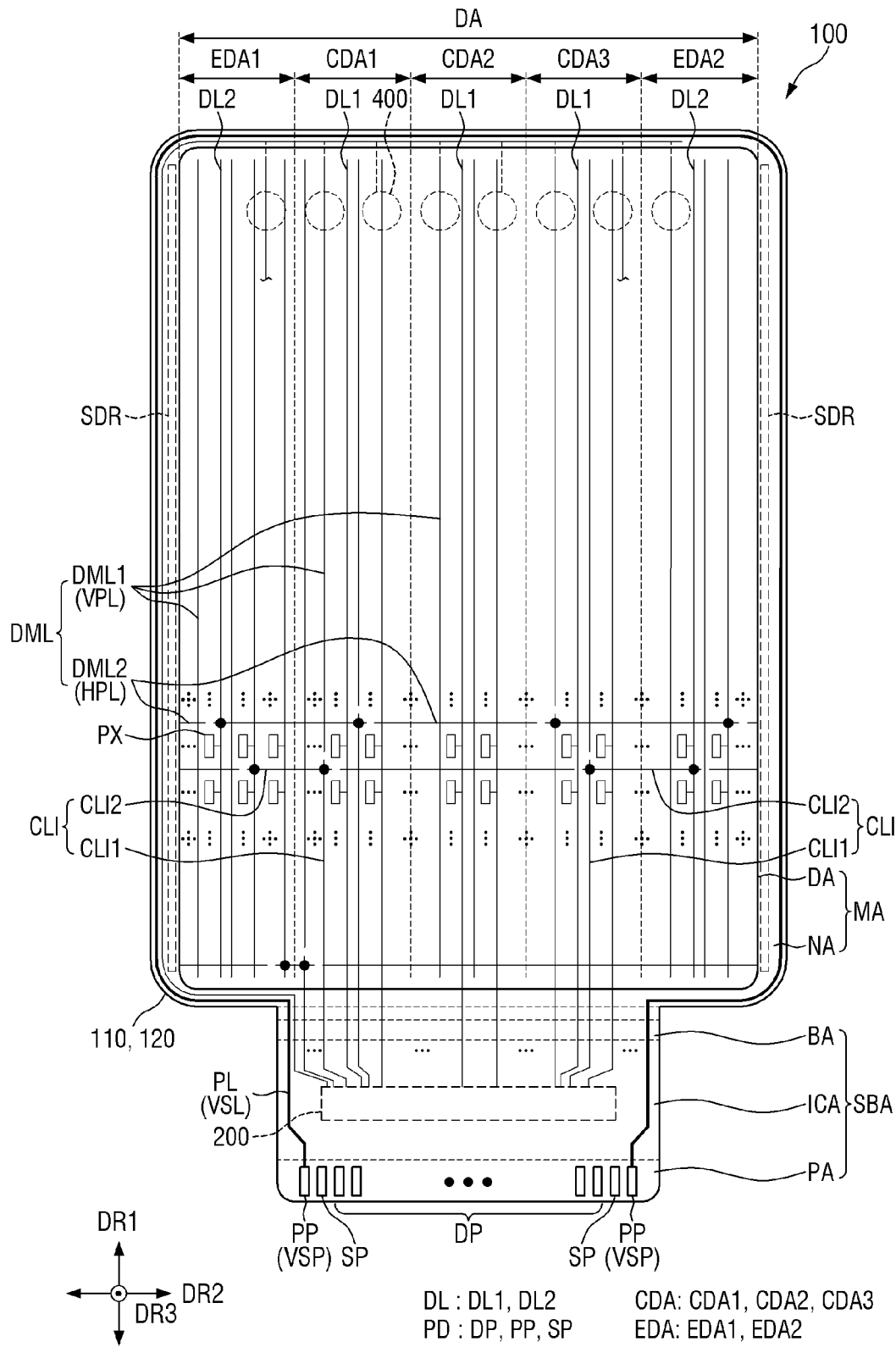
FIG. 9 is a plan view illustrating the display panel according to one embodiment.

FIG. 8 is a plan view illustrating the display panel 100 according to one embodiment. FIG. 9 is a plan view illustrating the display panel 100 according to one embodiment. For example, FIGS. 8 and 9 illustrate different embodiments with respect to the sensor area SA. FIGS. 8 and 9 show the display panel 100 in an unbent and unfolded state.

Referring to FIGS. 8 and 9 in addition to FIGS. 1 to 7, the display area DA may include the data lines DL and the pixels PX connected to the data lines DL. The display area DA may further include the scan lines SL (e.g., the scan lines SL of FIGS. 3 to 5) connected to the pixels PX, the emission control lines ECL (e.g., the emission control lines ECL of FIGS. 3 to 5), the power lines PL (e.g., the power lines PL of FIGS. 3 to 5), and at least one control signal line CSL (e.g., a part of the control signal line CSL of FIG. 4 or 5).

The non-display area NA may include the scan lines SL, the emission control lines ECL, the power lines PL, and other portions of at least one control signal line CSL connected to the pixels PX. In one embodiment, the non-display area NA may further include at least one embedded circuit SDR. For example, the embedded circuits SDR may be provided in the non-display area NA positioned on two sides of the display area DA in the second direction DR2.

The data lines DL may be provided or disposed in each pixel column. Each of the data lines DL may be connected to the pixels PX located in a corresponding pixel column.

The pixels PX may be arranged in each pixel row and each pixel column. The pixels PX may emit light at a luminance corresponding to each of the data signals (e.g., data voltage) supplied from the data lines DL.

The display area DA may be divided or partitioned into sub-regions corresponding to different sections in the second direction DR2. For example, the display area DA may include, with respect to the second direction DR2, a central area CDA located at the center of the display area DA and an edge area EDA located on at least one side of the central area CDA.

The central area CDA may aligned with the sub-region SBA in the first direction DR1. First data lines DL1 and the pixels PX connected to the first data lines DL1 may be arranged in the central area CDA.

The first data lines DL1 may extend from the sub-region SBA to the main region MA. The sub-region SBA may include a driving circuit mounting area ICA where the data driving circuit 200 is disposed or mounted, and a pad area PA where pads PD are disposed or provided, and may optionally further include a bending area BA where the display panel 100 is bendable.

The first data lines DL1 may connect the data driving circuit 200 to the pixels PX of the central area CDA. For example, the first data lines DL1 may extend from the driving circuit mounting area ICA to the central area CDA of the display area DA via the bending area BA and the non-display area NA.

Connection lines CLI (or a part of the connection lines CLI) may be further disposed in the central area CDA. The connection lines CLI may be disposed on the substrate 110 and may connect the data driving circuit 200 to second data lines DL2 located at the edge area EDA of the display area DA. For example, the connection lines CLI may be provided in the circuit layer 120 of the display panel 100 and may be connected between the data driving circuit 200 and the second data lines DL2.

Each of the connection lines CLI may include a first connection line CLI1 electrically connected between the data driving circuit 200 and a second data line DL2, and a second connection line CLI2 connected between the second data line DL2 and the first connection line CLI1. In one embodiment, the first connection line CLI1 may extend in the first direction at least in the display area DA (e.g., the central area CDA), and the second connection line CLI2 may extend in the second direction DR2 in the display area DA.

In one embodiment, the connection lines CLI may be disposed only in a part of the central area CDA, and may not be disposed in the remaining part of the central area CDA. For example, the central area CDA may include a first central area CDA1, a second central area CDA2, and a third central area CDA3 sequentially disposed in the second direction DR2, and the connection lines CLI may be disposed only in the first and third central areas CDA1 and CDA3 and not in the second central area CDA2. In the second direction DR2, the second central area CDA2 may be located at the center of the central area CDA, and the first and third central areas CDA1 and CDA3 may be located on sides of the second central area CDA2. The first central area CDA1 and the third central area CDA3 may be adjacent to a first edge area EDA1 and a second edge area EDA2, respectively. The connection lines CLI connected to the second data lines DL2 of the first edge area EDA1 may be disposed in the first central area CDA1, and the connection lines CLI connected to the second data lines DL2 of the second edge area EDA2 may be disposed in the third central area CDA3.

The second central area CDA2, which is not provided with the connection lines CLI, may include wires in a form similar to those of the first and third central areas CDA1 and CDA3, which are provided with the connection lines CLI. For example, the second central area CDA2 may include dummy lines DML (or a part of at least one power line PL) in a form corresponding to the connection lines CLI and dummy lines DML provided in the first and third central areas CDA1 and CDA3.

The second data lines DL2 and the pixels PX connected to the second data lines DL2 may be arranged in the edge area EDA. In one embodiment, the edge area EDA may include the first edge area EDA1 and the second edge area EDA2 located on sides of the central area CDA. For example, the edge area EDA may include the first edge area EDA1 adjacent to the first central area CDA1, and the second edge area EDA2 adjacent to the third central area CDA3.

The second data lines DL2 located in the first edge area EDA1 may be connected to the data driving circuit 200 through the connection lines CLI passing through the first central area CDA1. The second data lines DL2 located in the second edge area EDA2 may be connected to the data driving circuit 200 through the connection lines CLI passing through the third central area CDA3.

In one embodiment, the first data lines DL1 and the first connection lines CLI1 may extend from the driving circuit mounting area ICA into the display area DA, and may extend substantially in the first direction DR1 in the display area DA and the non-display area NA. For example, the first data lines DL1 and the first connection lines CLI1 may be formed as straight wires extending substantially in the first direction DR1 from the non-display area NA and the like below the display area DA.

Accordingly, the non-display area NA may be reduced. For example, to directly connect the second data lines DL2 to the data driving circuit 200 instead of connecting the second data lines DL2 to the data driving circuit 200 through the first connection lines CLI1 and the second connection lines CLI2, the second data lines DL2 may be formed as fan-out type wires having an oblique section in the non-display area NA below the display area DA, and the non-display area NA may be expanded to secure a space necessary for arranging the second data lines DL2 in a fan-out configuration, at least in the first direction DR1. However, in embodiments, since the first data lines DL1 and the first connection lines CLI1 are formed as straight wires extending substantially in the first direction DR1 from the non-display area NA and the like below the display area DA, it may be unnecessary to secure a space required for fan-out arrangement of the wires. Accordingly, the non-display area NA may be reduced or may be used more efficiently.

In one embodiment, the dummy lines DML separated from the data lines DL and the connection lines CLI may be further disposed in the display area DA. The dummy lines DML may be formed in the display area DA in a form corresponding to the connection lines CLI. For example, the dummy lines DML may include first dummy lines DML1 and second dummy lines DML2. The first dummy lines DML1 may extend in the first direction DR1 in the display area DA in a form corresponding to the first connection lines CLI1. The first dummy lines DML1 and the first connection lines CLI1 may be located in a same layer, but may be spaced apart from each other. The second dummy lines DML2 may extend in the second direction DR2 in the display area DA in a form corresponding to the second connection lines CLI2. The second dummy lines DML2 and the second connection lines CLI2 may be located in a same layer, but may be spaced apart from each other.

In one embodiment, the connection lines CLI and the dummy lines DML may be uniformly formed throughout the display area DA. For example, the connection lines CLI and the dummy lines DML may be formed in the display area DA at an overall uniform density and/or spacing. Accordingly, the wires may be uniformly disposed throughout the display area DA.

In one embodiment, some of the dummy lines DML may be used as the power lines PL. For example, some of the first dummy lines DML1 may be connected to the power line PL that supplies one type of power voltage, and used as a vertical power line VPL forming a part of the power line PL. Accordingly, a drop in the power voltage applied to the power line PL may be prevented or reduced, and the power voltage may be stably applied to the pixels PX. In one example, some of the first dummy lines DML1 may be connected to the second pixel power line VSL that supplies the second pixel power voltage ELVSS, and used as the vertical power line VPL forming a part of the second pixel power line VSL. At least some of the second dummy lines DML2 may be connected to the power line PL that supplies one type of power voltage, and used as a horizontal power line HPL forming a part of the power line PL. The use of the dummy lines DML may be variously changed according to embodiments.

In one embodiment, some others of the dummy lines DML may be used as the control signal line CSL. For example, at least some of the first dummy lines DML1 passing through the sensor area SA may be used as the control signal line CSL. In one example, some of the first dummy lines DML1 passing through the sensor area SA may be connected to the first electrode (e.g., gate electrode) of the switching element SW provided in at least one second pixel PX2 in the sensor area SA. Accordingly, the second pixels PX2 may be properly and/or readily connected to the control signal line CSL without forming a separate signal line in the display area DA.

In one embodiment, the sensor 400 may be located in the central area CDA as shown in FIG. 8. For example, at least one of the first central area CDA1, the second central area CDA2, and the third central area CDA3 may include at least one sensor area SA provided with the sensor 400. In one embodiment, at least one sensor 400 may be provided and/or disposed in each of the first central area CDA1, the second central area CDA2, and the third central area CDA3.

In another embodiment, the sensor 400 may be located in the central area CDA and the edge area EDA as shown in FIG. 9. For example, at least one of the first central area CDA1, the second central area CDA2, and the third central area CDA3, and at least one of the first edge area EDA1 and the second edge area EDA2 may include at least one sensor area SA provided with the sensor 400.

In another embodiment, the sensor 400 may not be located in the central area CDA, but may be located only in the edge area EDA. However, the disclosure is not limited thereto, and the number, position, arrangement structure, and/or the like of the sensors 400 may be variously changed according to embodiments.

The sub-region SBA may include the pad area PA. In the display device 10 in which the data driving circuit 200 and the like are mounted in the sub-region SBA, the sub-region SBA may further include the driving circuit mounting area ICA. In the display device 10 in which the sub-region SBA is bendable, the sub-region SBA may further include the bending area BA.

The pad area PA may be located in a part (e.g., lower edge area) of the sub-region SBA. The pad area PA may include the pads PD for connecting the display panel 100 to the circuit board 300 and the like. In one embodiment, the pads PD may include power pads PP, signal pads SP, and data pads DP.

Power voltages for driving the pixels PX, the embedded circuit SDR, the data driving circuit 200, and/or the like may be supplied to the power pads PP. FIGS. 8 and 9 show only the power pad PP (e.g., a second pixel power pad VSP) for transmitting one power voltage (e.g., the second pixel power voltage ELVSS), but the pads PD may include respective power pads PP required for supplying various power voltages necessary for driving the display panel 100.

In one embodiment, at least one of the power lines PL connected to the power pads PP may be formed in the non-display area NA to surround the display area DA in a plan view, and may be connected to at least two power pads PP. For example, the second pixel power line VSL may be formed in the non-display area NA to surround the display area DA in a plan view. FIGS. 8 and 9 show the second pixel power line VSL formed outside the display area DA, but the disclosure is not limited thereto, and the second pixel power line VSL may also be provided inside the display area DA to be connected to the second pixel power line VSL outside the display area DA to transmit the second pixel power voltage ELVSS to the pixels PX.

In one embodiment, the second pixel power line VSL may be connected to at least one first dummy line DML1 and/or at least one second dummy line DML2. For example, some of the dummy lines DML may be used as the second pixel power line VSL.

Signals for controlling the embedded circuit SDR, the data driving circuit 200, and/or the like may be supplied to the signal pads SP.

The image data (or image signals) used to generate the data signals may be supplied to the data pads DP.

The bending area BA may be an area where the display panel 100 is bendable. For example, the display panel 100 may be bent in the bending area BA so that a part of the sub-region SBA may be located behind the main region MA. In one embodiment, the bending area BA may be located adjacent to the main region MA. For example, the bending area BA may be located between the main region MA and the driving circuit mounting area ICA, and may be adjacent to a boundary between the main region MA and the sub-region SBA. Accordingly, a bezel area may be reduced or minimized.

The data driving circuit 200 may be mounted in the driving circuit mounting area ICA. The data driving circuit 200 may generate the driving signals necessary for driving the pixels PX. For example, the data driving circuit 200 may generate the data signals corresponding to the image data and supply the data signals to the pixels PX.

Figure 10:
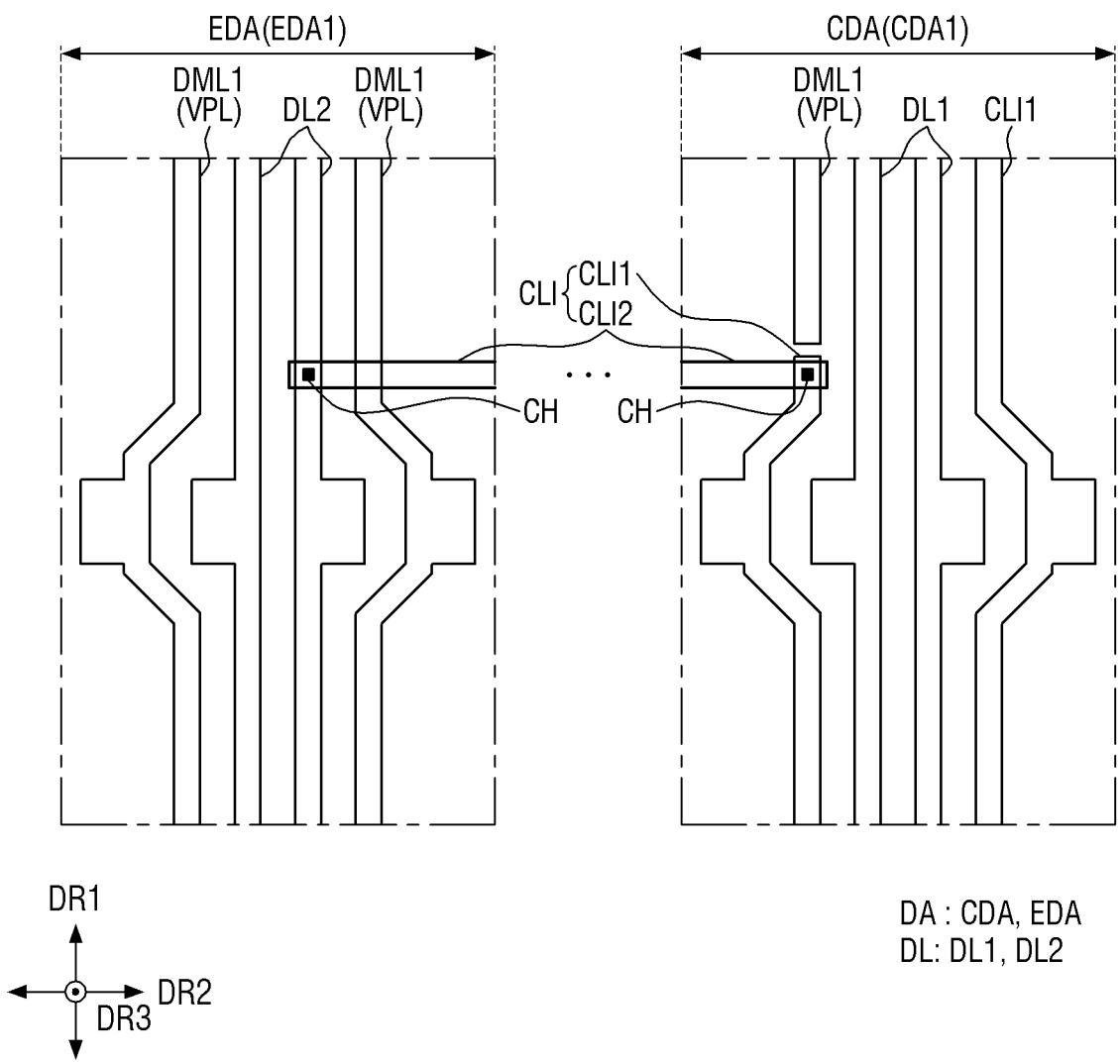
FIG. 10 is a plan view schematically illustrating data lines, first dummy lines, and connection lines in a central area and an edge area according to one embodiment.

FIG. 10 is a plan view schematically illustrating the data lines DL, the first dummy lines DML1, and the connection lines CLI in the central area CDA and the edge area EDA according to one embodiment. For example, FIG. 10 schematically illustrates the arrangement structure of the data lines DL, the first dummy lines DML1, and the connection lines CLI located in a part of the first central area CDA1 and a part of the first edge area EDA1.

Referring to FIG. 10 in addition to FIGS. 1 to 9, the first data lines DL1, the dummy lines DML (or the power lines PL including the vertical power lines VPL) including the first dummy lines DML1, and the connection lines CLI including the first connection lines CLI1 and the second connection lines CLI2 (a part of each of the second connection lines CLI2) may be disposed in the central area CDA.

The first data lines DL1, the first dummy lines DML1, and the first connection lines CLI1 may extend substantially in the first direction DR1 in the central area CDA. In one embodiment, at least one of the first data lines DL1, the first dummy lines DML1, and the first connection lines CLI1 may have a partially curved and/or protruding shape to be properly or readily connected to the corresponding elements (e.g., circuit elements, electrodes, wires, and/or bridge patterns, and the like) within the display area DA.

In one embodiment, the first data lines DL1, the first dummy lines DML1, and the first connection lines CLI1 may be regularly arranged in the second direction DR2 in the central area CDA. For example, as shown in FIGS. 8 and 9, the first data lines DL1, the first dummy lines DML1, and the first connection lines CLI1 may be alternately arranged in the second direction DR2 in the central area CDA. For example, as shown in FIG. 10, two first data lines DL1 may be adjacent to each other on a basis of two pixel columns in the central area CDA, and at least one first dummy line DML1 and/or at least one first connection line CLI1 may be disposed on a side of the two first data lines DL1.

The second data lines DL2, the dummy lines DML (or the power lines PL including the vertical power lines VPL) including the first dummy lines DML1, and another part of each of the second connection lines CLI2 may be disposed in the edge area EDA. The first connection lines CLI1 may not be provided in the edge area EDA. For example, the first dummy lines DML1 may be disposed at positions corresponding to the first connection lines CLI1 in each pixel column.

The second data lines DL2 and the first dummy lines DML1 may extend substantially in the first direction DR1 in the edge area EDA. In one embodiment, at least one of the second data lines DL2 and the first dummy lines DML1 may have a partially curved and/or protruding shape to be properly or readily connected to the corresponding elements within the display area DA.

In one embodiment, the second data lines DL2 and the first dummy lines DML1 may be regularly arranged in the second direction DR2 in the edge area EDA. For example, as shown in FIGS. 8 and 9, the second data lines DL2 and the first dummy lines DML1 may be alternately arranged in the second direction DR2 in the edge area EDA. For example, as shown in FIG. 10, two second data lines DL2 may be adjacent to each other on a basis of two pixel columns in the edge area EDA, and two first dummy lines DML1 may be disposed on a side of the two second data lines DL2.

The second connection lines CLI2 may extend in the second direction DR2 between each of the first connection lines CLI1 and the second data lines DL2. For example, each of the second connection lines CLI2 may extend in the second direction DR2 across the central area CDA and the edge area EDA to connect the first connection line CLI1 and the second data line DL2 that are a pair corresponding to each other. In one embodiment, each of the second connection lines CLI2 may include ends intersecting a pair of the first connection line CLI1 and the second data line DL2, and may be electrically connected to the pair of the first connection line CLI1 and the second data line DL2 through at least one contact hole CH at each end.

In one embodiment, the first connection lines CLI1 and the second connection lines CLI2 may be disposed in different layers. For example, the first connection lines CLI1 may be provided in the second source-drain conductive layer (e.g., the fifth conductive layer CDL5 of FIG. 7) of the circuit layer 120, and the second connection lines CLI2 may be provided in the first source-drain conductive layer (e.g., the fourth conductive layer CDL4 of FIG. 7) of the circuit layer 120.

In one embodiment, the data lines DL, the first dummy lines DML1, and the first connection lines CLI1 may be disposed in a same layer. For example, the data lines DL and the first dummy lines DML1 may be provided in the second source-drain conductive layer of the circuit layer 120.

In one embodiment, as shown in FIGS. 8 and 9, the display area DA may be provided with the second dummy lines DML2 extending in the second direction DR2 in a form corresponding to the second connection lines CLI2. In one embodiment, the second dummy lines DML2 and the second connection lines CLI2 may be disposed in a same layer. For example, the second dummy lines DML2 may be provided in the first source-drain conductive layer of the circuit layer 120.

However, the disclosure is not limited thereto, and the arrangement structure of the data lines DL, the dummy lines DML, and the connection lines CLI may be variously changed.

Figure 11:
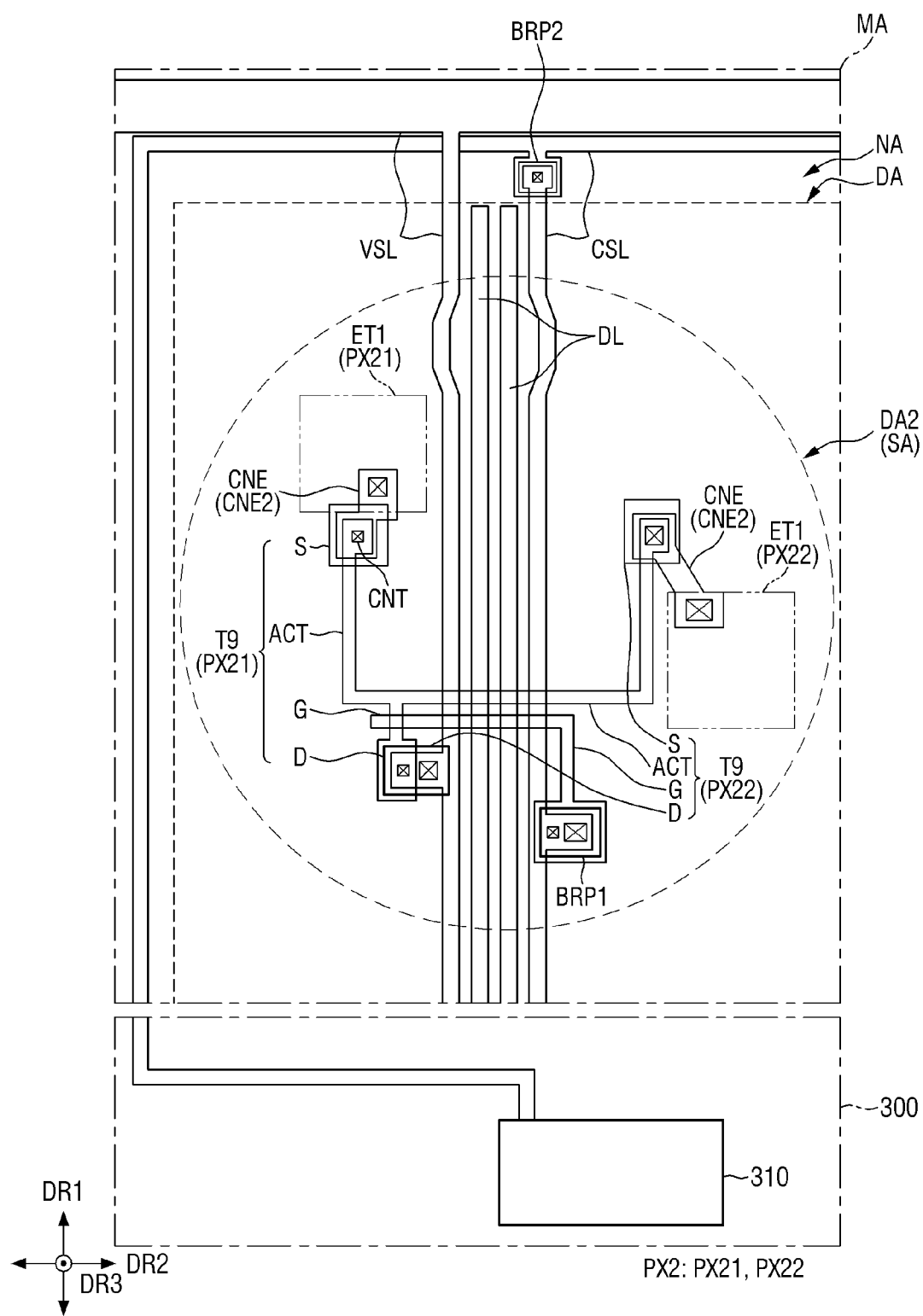
FIG. 11 is a plan view illustrating a ninth transistor of the second pixel according to one embodiment.

FIG. 11 is a plan view illustrating the ninth transistor T9 of the second pixel PX2 according to one embodiment. For example, FIG. 11 is a plan view schematically illustrating the ninth transistors T9 provided in two second pixels PX2 (referred to as "twenty-first pixel PX21" and "twenty-second pixel PX22") located in two adjacent pixel columns in the sensor area SA, and the second pixel power line VSL and the control signal line CSL connected to the ninth transistors T9. Each of the second pixels PX2 according to the embodiment of FIG. 11 may include the ninth transistor T9 according to the embodiment of FIG. 4.

Referring to FIG. 11 in addition to FIGS. 1 to 10, each of the second pixels PX2 may include the ninth transistor T9 having an active layer ACT, a gate electrode G, a first electrode S (e.g., source electrode), and a second electrode D (e.g., drain electrode). The first electrode S of the ninth transistor T9 may be a source region included in the active layer ACT of the ninth transistor T9, and/or a bridge electrode connected to the source region. The second electrode D of the ninth transistor T9 may be a drain region included in the active layer ACT of the ninth transistor T9, and/or a bridge electrode connected to the drain region.

The active layer ACT of the ninth transistor T9 may be provided in one of the semiconductor layers provided in the circuit layer 120 of the display panel 100. For example, the active layer ACT of the ninth transistor T9 may be provided in the first semiconductor layer SCL1 (or the second semiconductor layer SCL2) of FIG. 7.

The active layer ACT of the ninth transistor T9 may include a channel region overlapping the gate electrode G in a plan view, a source region located on a side of the channel region and connected to the first electrode S (or bridge electrode) through at least one contact portion CNT, and a drain region located on another side of the channel region and connected to the second electrode D (or bridge electrode) through at least one other contact portion CNT. For example, the active layer ACT of the ninth transistor T9 provided in the twenty-first pixel PX21 may include a channel region overlapping the gate electrode G of the ninth transistor T9 in a plan view, a source region connected to the first electrode S of the ninth transistor T9, and a drain region connected to the second electrode D of the ninth transistor T9. Similarly, the active layer ACT of the ninth transistor T9 provided in the twenty-second pixel PX22 may include a channel region overlapping the gate electrode G of the ninth transistor T9 in a plan view, a source region connected to the first electrode S of the ninth transistor T9, and a drain region connected to the second electrode D of the ninth transistor T9. For simplicity, in FIG. 11, only one contact portion CNT is marked with a reference sign. Each contact portion CNT may include at least one contact hole and/or via hole.

In one embodiment, the active layers ACT of the ninth transistors T9 provided in at least two adjacent second pixels PX2 may be integral with each other. For example, the active layer ACT of the ninth transistor T9 provided in the twenty-first pixel PX21 and the active layer ACT of the ninth transistor T9 provided in the twenty-second pixel PX22 may be integrally formed as a single semiconductor pattern.

The gate electrode G of the ninth transistor T9 may be provided in one of the gate conductive layers provided in the circuit layer 120. For example, the gate electrode G of the ninth transistor T9 may be provided in the first conductive layer CDL1 (e.g., the first gate conductive layer) of FIG. 7. In another example, the gate electrode G of the ninth transistor T9 may be provided in the third conductive layer CDL3 (e.g., the third gate conductive layer) of FIG. 7. The gate electrode G of the ninth transistor T9 may overlap the active layer ACT of the ninth transistor T9 in a plan view with at least one insulating layer interposed between the gate electrode G of the ninth transistor T9 and the active layer ACT of the ninth transistor T9.

In one embodiment, the gate electrodes G of the ninth transistors T9 provided in at least two adjacent second pixels PX2 may be integrally with each other. For example, the gate electrode G of the ninth transistor T9 provided in the twenty-first pixel PX21 and the gate electrode G of the ninth transistor T9 provided in the twenty-second pixel PX22 may be integrally formed as a single electrode or conductive pattern.

The gate electrode G of the ninth transistor T9 may be connected to the control signal line CSL. For example, the gate electrode G of the ninth transistor T9 may be electrically connected to the control signal line CSL via at least one contact portion CNT and/or a first bridge pattern BRP1. In one embodiment, the first bridge pattern BRP1 may be provided in a conductive layer disposed between the conductive layer provided with the gate electrode G of the ninth transistor T9 and the conductive layer provided with the control signal line CSL. For example, the first bridge pattern BRP1 may be provided in the fourth conductive layer CDL4 (e.g., the first source-drain conductive layer) of FIG. 7.

The control signal line CSL may be connected between the driving circuit 310 and the second pixels PX2. The control signal line CSL may transmit the off-control signal output from the driving circuit 310 to the second pixels PX2. For example, the control signal line CSL may be connected to the gate electrode G of the ninth transistor T9 of each of the second pixels PX2, and may transmit the off-control signal output from the driving circuit 310 to the gate electrode G of the ninth transistor T9.

In one embodiment, the control signal line CSL, and the data lines DL and the first dummy lines DML1 (or the vertical power line VPL of the second pixel power line VSL) in the display area DA may be provided in a same layer. For example, the control signal line CSL may be provided in the fifth conductive layer CDL5 (e.g., the second source-drain conductive layer) of FIG. 7 together with the data lines DL and the first dummy lines DML1 in the display area DA.

In one embodiment, some of the first dummy lines DML1 passing through the second display area DA2 (e.g., the sensor area SA) may be used as the control signal line CSL. Another first dummy lines DML1 may be used as the power line PL. For example, the another first dummy lines DML1 may be used as the second pixel power line VSL. As such, only some of the first dummy lines DML1 may be used as the control signal line CSL and the another first dummy lines DML1 may be used as the power line PL, as needed, thereby reducing or minimizing the drop in power voltage.

In one embodiment, the control signal line CSL may be provided in one of the gate conductive layers provided in the circuit layer 120, in the outside of the display area DA, e.g., in the non-display area NA and the sub-region SBA. For example, the control signal line CSL may be provided in the second conductive layer CDL2 (e.g., the second gate conductive layer) of FIG. 7 outside the display area DA. In one embodiment, the wiring portions of the control signal line CSL provided in different conductive layers of the circuit layer 120 may be electrically connected to each other through at least one contact portion CNT and/or a second bridge pattern BRP2. In one embodiment, the second bridge pattern BRP2 may be provided in the fourth conductive layer CDL4 of FIG. 7.

The first electrode S of the ninth transistor T9 may be provided in one of the source-drain conductive layers provided in the circuit layer 120. For example, the first electrode S of the ninth transistor T9 may be provided in the fourth conductive layer CDL4 of FIG. 7.

The first electrode S of the ninth transistor T9 may be connected to the first electrode ET1 of the light emitting element EL provided in the corresponding second pixel PX2. For example, the first electrode S of the ninth transistor T9 provided in the twenty-first pixel PX21 may be electrically connected to the first electrode ET1 of the light emitting element EL provided in the twenty-first pixel PX21 through at least one contact portion CNT and/or the connection electrode CNE. The first electrode S of the ninth transistor T9 provided in the twenty-second pixel PX22 may be electrically connected to the first electrode ET1 of the light emitting element EL provided in the twenty-second pixel PX22 through at least one contact portion CNT and/or the connection electrode CNE.

The second electrode D of the ninth transistor T9 may be provided in one of the source-drain conductive layers provided in the circuit layer 120. For example, the second electrode D of the ninth transistor T9 may be provided in the fourth conductive layer CDL4 of FIG. 7.

The second electrode D of the ninth transistor T9 may be connected to the second pixel power line VSL. For example, the second electrode D of the ninth transistor T9 may be electrically connected to the second pixel power line VSL through at least one contact portion CNT.

In one embodiment, the second electrodes D of the ninth transistors T9 provided in at least two adjacent second pixels PX2 may be integral with each other. For example, the second electrode D of the ninth transistor T9 provided in the twenty-first pixel PX21 and the second electrode D of the ninth transistor T9 provided in the twenty-second pixel PX22 may be integrally formed as a single electrode or conductive pattern.

The second pixel power line VSL may be connected between the power pad PP (e.g., the second pixel power pad VSP of FIGS. 8 and 9) and the pixels PX. For example, the second pixel power line VSL may be connected between the power pad PP and the second electrodes ET2 of the light emitting elements EL provided in the pixels PX. The second pixel power line VSL may transmit the second pixel power voltage ELVSS supplied from the power pad PP or the like to the pixels PX.

In one embodiment, the second pixel power line VSL may be further connected to the ninth transistors T9 provided in the second pixels PX2. For example, the second pixel power line VSL may be electrically connected to the second electrodes D of the ninth transistors T9 provided in the second pixels PX2 in the second display area DA2.

In one embodiment, the first dummy lines DML1 provided in the display area DA may be used as the second pixel power line VSL. For example, the second pixel power line VSL may include the vertical power line VPL provided in the same layer as the data lines DL. In one embodiment, the second pixel power line VSL may be provided in at least the fifth conductive layer CDL5 of FIG. 7. In one embodiment, the second pixel power line VSL may be provided in the fifth conductive layer CDL5 of FIG. 7 even outside the display area DA. However, the disclosure is not limited thereto, and the structure and/or position of the second pixel power line VSL may be variously changed according to embodiments.

Figure 12:
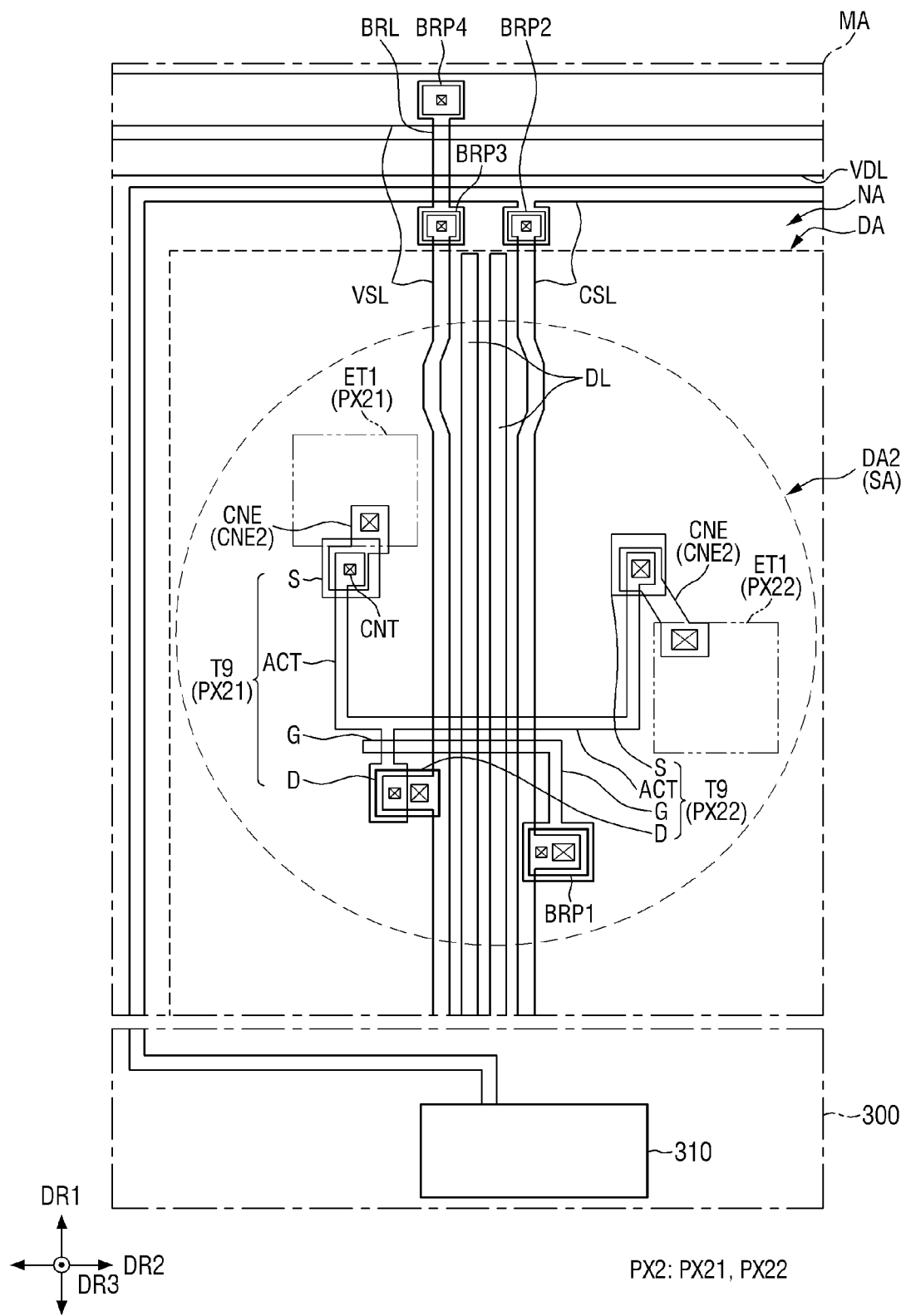
FIG. 12 is a plan view illustrating the ninth transistor of the second pixel according to one embodiment.

FIG. 12 is a plan view illustrating the ninth transistor T9 of the second pixel PX2 according to one embodiment. For example, FIG. 12 schematically illustrates a modified embodiment of the embodiment of FIG. 11, and the second pixel power line VSL of FIG. 12 may include a bridge line BRL provided in a different conductive layer adjacent to the display area DA. In describing the embodiment of FIG. 12, redundant descriptions of components similar to or identical to those of the embodiment of FIG. 11 will be omitted.

Referring to FIG. 12 in addition to FIGS. 1 to 11, the display device 10 may further include, in the non-display area NA, at least one wire, e.g., the first pixel power line VDL, provided in the same conductive layer (e.g., the fifth conductive layer CDL5) as the second pixel power line VSL and passing through a region between the second pixel power line VSL and the display area DA. The second pixel power line VSL may include the bridge line BRL provided in a different conductive layer from the first pixel power line VDL and the control signal line CSL, at the intersection with the first pixel power line VDL and the control signal line CSL. In FIG. 12, a separate reference sign is assigned to the bridge line BRL, but the bridge line BRL may be a part of the second pixel power line VSL.

In one embodiment, the bridge line BRL may be provided in one of the gate conductive layers provided in the circuit layer 120. For example, the bridge line BRL may be provided in the first conductive layer CDL1 (e.g., the first gate conductive layer), the second conductive layer CDL2 (e.g., the second gate conductive layer), or the third conductive layer CDL3 (e.g., the third gate conductive layer).

The wiring portions of the second pixel power line VSL provided in different conductive layers of the circuit layer 120 may be electrically connected to each other through at least one contact portion CNT, a third bridge pattern BRP3, and/or a fourth bridge pattern BRP4. In one embodiment, the third bridge pattern BRP3 and/or the fourth bridge pattern BRP4 may be provided in the fourth conductive layer CDL4 of FIG. 7.

Figure 13:
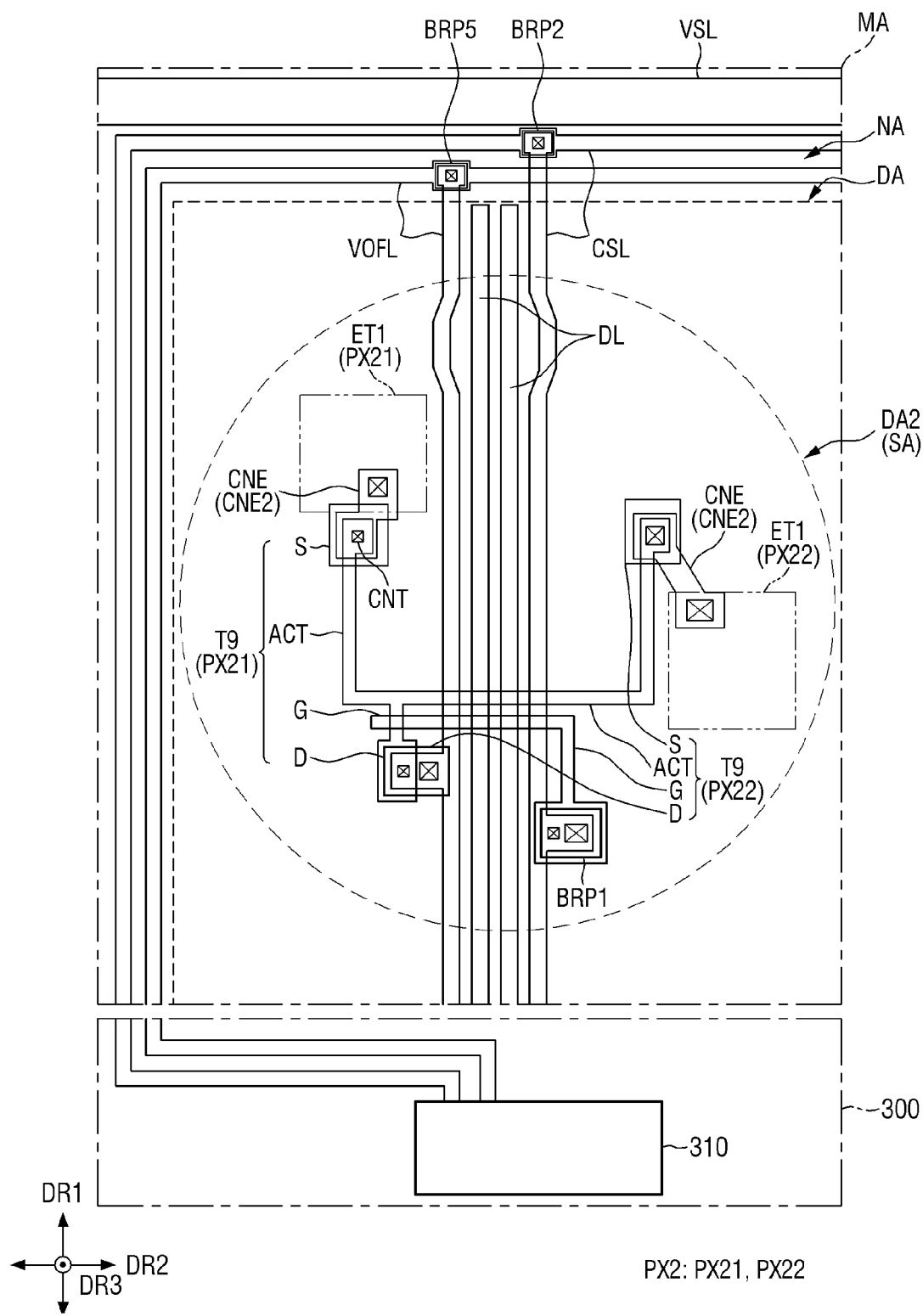
FIG. 13 is a plan view illustrating the ninth transistor of the second pixel according to one embodiment.

FIG. 13 is a plan view illustrating the ninth transistor T9 of the second pixel PX2 according to one embodiment. For example, FIG. 13 schematically illustrates a modified embodiment of the embodiment of FIG. 11, and each of the second pixels PX2 of FIG. 13 may include the ninth transistor T9 according to the embodiment of FIG. 5. In describing the embodiment of FIG. 13, redundant descriptions of components similar to or identical to those of the embodiment of FIG. 11 will be omitted.

Referring to FIG. 13 in addition to FIGS. 1 to 12, the display device 10 may include the off power line VOFL connected between the driving circuit 310 and the second pixels PX2, and the ninth transistors T9 of the second pixels PX2 may be connected to the off power line VOFL. For example, the second electrode D of each of the ninth transistors T9 may be connected to the off power line VOFL.

In one embodiment, the off power line VOFL may be provided in the same conductive layer as the control signal line CSL, and may be separated from the control signal line CSL and the second pixel power line VSL. For example, the off power line VOFL may be provided in the same layer (e.g., the fifth conductive layer CDL5 of FIG. 7) as the control signal line CSL inside the display area DA, and may be provided in the same layer (e.g., the second conductive layer CDL2 of FIG. 7) as the control signal line CSL even outside the display area DA. In one embodiment, the wiring portions of the off power line VOFL provided in different conductive layers of the circuit layer 120 may be electrically connected to each other through at least one contact portion CNT and/or a fifth bridge pattern BRP5. In one embodiment, the fifth bridge pattern BRP5 may be provided in the fourth conductive layer CDL4 of FIG. 7.

During a period in which the sensor 400 operates, the driving circuit 310 may supply an off-control signal that allows the ninth transistor T9 to be turned on to the control signal line CSL, and may supply an off voltage at a level that allows the light emitting elements EL of the second pixels PX2 to be non-emitting to the off power line VOFL. Accordingly, during a period in which the sensor 400 operates, the second pixels PX2 may maintain an off state (e.g., a non-emission state).

Figure 14:
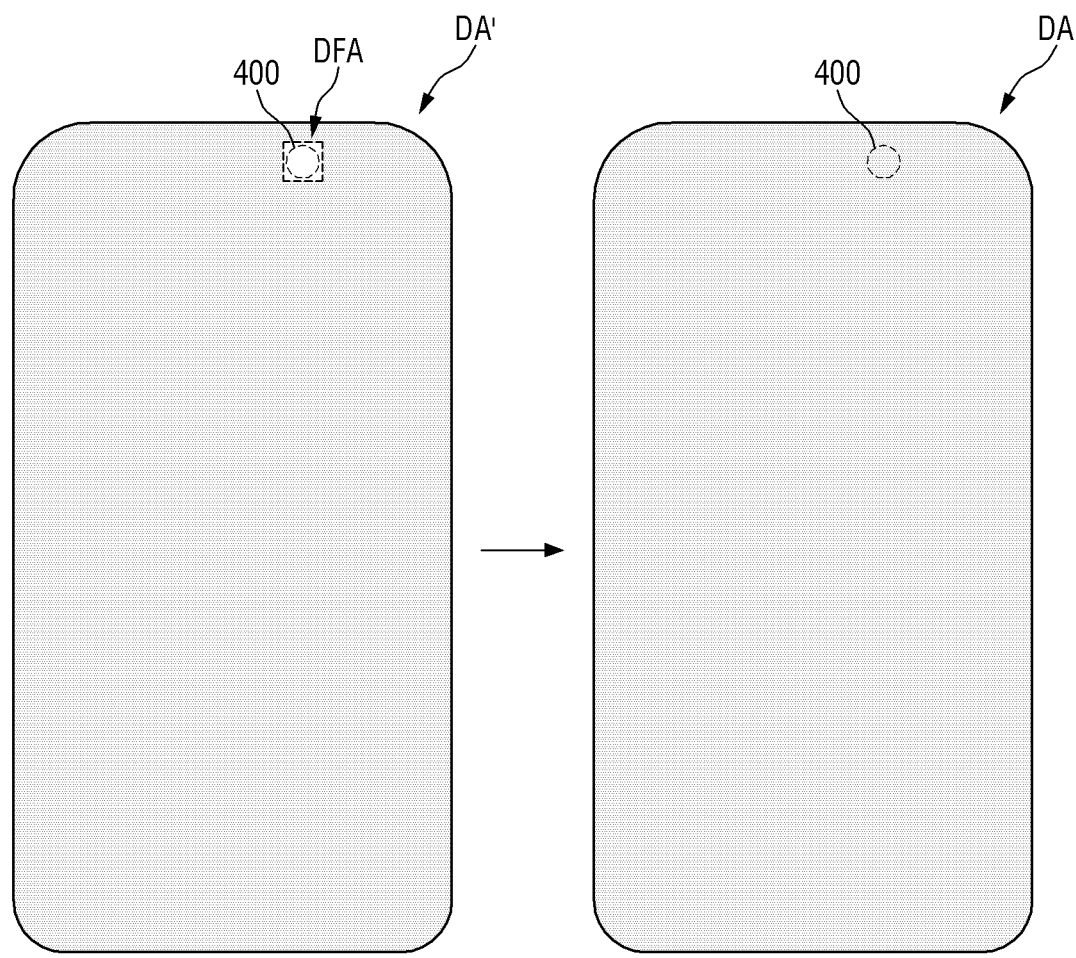
FIG. 14 is a plan view illustrating that stains that may appear in the display area are prevented when the second pixels are turned off.

FIG. 14 is a plan view illustrating that stains that may appear in the display area DA are prevented when the second pixels PX2 are turned off.

Referring to FIG. 14 in addition to FIGS. 1 to 13, in a display device to which the above-described embodiments are not applied (e.g., a display device in which the pixels PX at positions corresponding to the sensor area SA do not include a separate switching element SW controlled by the driving circuit 310), as the sensor 400 operates, the characteristics of at least some of the pixel transistors T provided in the pixels PX in a region corresponding to the sensor 400 may change, causing the pixels PX to emit unintentionally. Accordingly, stains may be visually recognized in a display area DA'. For example, even in case that a black screen is displayed in the display area DA' while the sensor 400 is operating, the pixels PX at positions corresponding to the sensor 400 may emit light, so that an image quality defect DFA in the form of a stain may be visually recognized.

However, in the display device 10 according to the above-described embodiments, during a period in which the sensor 400 operates, an off voltage (e.g., the second pixel power voltage ELVSS or a separate off voltage VOFF) capable of turning off the light emitting elements EL may be applied to the first electrode ET1 of each of the light emitting elements EL of the second pixels PX2 through the ninth transistors T9 provided in the second pixels PX2 at positions corresponding to the sensor 400. This may prevent the second pixel PX2 from emitting light in an abnormal manner and prevent stains from appearing in the display area DA.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a display area comprising a first display area and a sensor area;
   a first pixel located in the first display area, and comprising a first pixel circuit and a first light emitting element connected to the first pixel circuit; and
   a second pixel located in the sensor area, and comprising a second pixel circuit and a second light emitting element connected to the second pixel circuit, wherein
   structures of the first pixel circuit are different than structures of the second pixel circuit,
   the second pixel circuit comprises:
   a power line to which an off voltage is applied;
   a switching element connected between the power line and the second light emitting element, the switching element being controlled by an off-control signal such that a voltage difference across the second light emitting element is smaller than a threshold voltage of the second light emitting element in response to the switching element being turned on; and
   an emission control switch connected to the second light emitting element, emission control switch being controlled by an emission control signal such that a driving current is applied to the second light emitting element in response to the emission control switch being turned on, and the off-control signal is different than the emission control signal.

2. The display device of claim 1, further comprising:
a driving circuit supplying the off-control signal to the second pixel.

3. The display device of claim 2, further comprising:
a signal line connected between the driving circuit and the second pixel and transmitting the off-control signal from the driving circuit to the second pixel,
wherein the switching element comprises:
   a gate electrode connected to the signal line;
   a first electrode connected to an electrode of the second light emitting element; and
   a second electrode connected to the power line.

4. The display device of claim 3, further comprising:
a substrate comprising a main region comprising the display area in which pixels comprising the first pixel and the second pixel are arranged, and a sub-region located on a side of the main region in a first direction; and
a data driving circuit disposed on the sub-region and supplying a data signal to the pixels,
wherein the display area comprises:
   a central area located at a center of the display area in a second direction intersecting the first direction and aligned with the sub-region in the first direction, and in which first data lines and some of the pixels connected to the first data lines are arranged; and
   an edge area located on at least one side of the central area in the second direction, and in which second data lines and another ones of the pixels connected to the second data lines are arranged.

5. The display device of claim 4, further comprising:
connection lines disposed on the substrate and connected between the data driving circuit and the second data lines,
wherein each of the connection lines comprises:
   a first connection line connected between the data driving circuit and one of the second data lines and extending in the first direction in the display area; and
   a second connection line connected between the first connection line and the one of the second data lines and extending in the second direction in the display area.

6. The display device of claim 5, further comprising:
a circuit layer disposed on the substrate, and comprising pixel circuits of the pixels comprising the first pixel circuit and the second pixel circuit, the first data lines, the second data lines, the power line, and the signal line.

7. The display device of claim 6, wherein the circuit layer further comprises:
a semiconductor layer comprising an active layer of the switching element;
a first gate conductive layer comprising the gate electrode of the switching element;
a first source-drain conductive layer comprising the second connection line; and
a second source-drain conductive layer comprising the first connection line.

8. The display device of claim 7, wherein the power line is connected to the second electrode of the switching element in the sensor area.

9. The display device of claim 7, wherein the signal line is connected to the gate electrode of the switching element in the sensor area.

10. The display device of claim 6, further comprising:
a light emitting element layer disposed on the circuit layer, and comprising light emitting elements of the pixels comprising the first light emitting element and the second light emitting element.

11. The display device of claim 2, further comprising:
a first pixel power line connected to the first pixel circuit and the second pixel circuit and supplied with a first pixel power voltage; and
a second pixel power line connected to the first light emitting element and the second light emitting element and supplied with a second pixel power voltage having a lower potential than the first pixel power voltage.

12. The display device of claim 11, wherein the switching element is connected to the second pixel power line.

13. The display device of claim 11, wherein the power line to which the switching element is connected is separated from the first pixel power line and the second pixel power line.

14. The display device of claim 13, wherein
the power line is connected between the driving circuit and the second pixel, and
the driving circuit supplies the off voltage of the second light emitting element to the power line.

15. The display device of claim 2, further comprising:
a sensor provided in the sensor area,
wherein the driving circuit supplies the off-control signal to the second pixel during a period in which the sensor operates.

16. The display device of claim 15, wherein the sensor emits infrared rays passing through the sensor area where the second pixel is located.

17. The display device of claim 16, wherein the sensor is an infrared proximity sensor.

18. The display device of claim 1, wherein
each of the first pixel circuit and the second pixel circuit comprises pixel transistors and a capacitor controlling a driving current in response to a scan signal and a data signal supplied to the first pixel or the second pixel, and
the second pixel circuit further comprises the switching element in addition to the pixel transistors and the capacitor.

19. The display device of claim 18, wherein
the first display area does not overlap the sensor area in a plan view, and
the switching element is provided only in the second pixel.

20. The display device of claim 1, wherein
the second pixel comprises a plurality of second pixels in the sensor area, and
each of the plurality of second pixels comprises the switching element connected between the power line and the second light emitting element and simultaneously turned on by the off-control signal.

21. An electronic device comprising:
a display device comprising:
   a display area comprising a first display area and a sensor area;
   a first pixel located in the first display area, and comprising a first pixel circuit and a first light emitting element connected to the first pixel circuit; and
   a second pixel located in the sensor area, and comprising a second pixel circuit and a second light emitting element connected to the second pixel circuit, structures of structures of the first pixel circuit are different than structures of the second pixel circuit, the second pixel circuit comprises:

a power line to which an off voltage is applied;

a switching element connected between the power line and the second light emitting element, the switching element being controlled by an off-control signal such that a voltage difference across the second light emitting element is smaller than a threshold voltage of the second light emitting element in response to the switching element being turned on; and an emission control switch connected to the second light emitting element, emission control switch being controlled by an emission control signal such that a driving current is applied to the second light emitting element in response to the emission control switch being turned on, and the off-control signal is different than the emission control signal.

22. The electronic device of claim 21, further comprising:
a driving circuit supplying the off-control signal to the second pixel.

23. The electronic device of claim 22, further comprising:
a signal line connected between the driving circuit and the second pixel and transmitting the off-control signal from the driving circuit to the second pixel, wherein the switching element comprises:

a gate electrode connected to the signal line;

a first electrode connected to an electrode of the second light emitting element; and a second electrode connected to the power line.

* * * * *